(12) United States Patent
Fries

(10) Patent No.: US 7,271,877 B2
(45) Date of Patent: *Sep. 18, 2007

(54) METHOD AND APPARATUS FOR MASKLESS PHOTOLITHOGRAPHY

(75) Inventor: David P. Fries, St. Petersburg, FL (US)

(73) Assignee: University of South Florida, Tampa, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/398,905

(22) Filed: Apr. 6, 2006

(65) Prior Publication Data

US 2006/0256307 A1 Nov. 16, 2006

Related U.S. Application Data

(60) Division of application No. 10/408,696, filed on Apr. 7, 2003, which is a continuation-in-part of application No. 10/179,083, filed on Jun. 25, 2002, now Pat. No. 6,544,698, and a continuation-in-part of application No. 10/179,565, filed on Jun. 25, 2002, now Pat. No. 6,998,219.

(60) Provisional application No. 60/301,218, filed on Jun. 27, 2001.

(51) Int. Cl.
*G03B 27/32* (2006.01)
*G03B 27/54* (2006.01)
*G03F 9/00* (2006.01)

(52) U.S. Cl. .............................. 355/67; 355/77; 430/22

(58) Field of Classification Search ................ 355/35, 355/53, 67, 71, 77; 430/5, 22, 30, 296, 396; 250/492.2

See application file for complete search history.

(56) References Cited

U.S. PATENT DOCUMENTS 3,925,677 A 12/1975 Fraser (Continued)

FOREIGN PATENT DOCUMENTS

EP 0 971 387 1/2000

(Continued)

OTHER PUBLICATIONS

Singh-Gasson et al., "Maskless Fabrication of Light-Directed Oligonucleotide Microarrays Using a Digital Micromirror Array", Nature Biotechnology, 1999, pp. 974-978, vol. 17.

(Continued)

*Primary Examiner*—Rodney Fuller
(74) *Attorney, Agent, or Firm*—Saliwanchik, Lloyd & Saliwanchik

(57) ABSTRACT

A method and apparatus to create two dimensional and three dimensional structures using a maskless photolithography system that is semi-automated, directly reconfigurable, and does not require masks, templates or stencils to create each of the planes or layers on a multi layer two-dimensional or three dimensional structure. In an embodiment, the pattern generator comprises a micromirror array wherein the positioning of the mirrors in the micromirror array and the time duration of exposure can be modulated to produce gray scale patterns to photoform layers of continuously variable thickness. The desired pattern can be designed and stored using conventional computer aided drawing techniques and can be used to control the positioning of the individual mirrors in the micromirror array to reflect the corresponding desired pattern. A fixture for mounting of the substrate can be incorporated and can allow the substrate to be moved three dimensions. The fixture can be rotated in one, two, or three directions.

90 Claims, 9 Drawing Sheets

U.S. PATENT DOCUMENTS

| | | | |
|---|---|---|---|
| 4,199,688 | A | 4/1980 | Ozasa |
| 5,523,193 | A | 6/1996 | Nelson |
| 5,585,477 | A | 12/1996 | Kilpatrick |
| 5,661,500 | A | 8/1997 | Shinoda et al. |
| 5,672,464 | A | 9/1997 | Nelson |
| 5,691,541 | A | 11/1997 | Ceglio et al. |
| 5,866,913 | A | 2/1999 | Robinson |
| 5,870,176 | A | 2/1999 | Sweatt et al. |
| 5,900,637 | A | 5/1999 | Smith |
| 6,060,224 | A | 5/2000 | Sweatt et al. |
| 6,177,980 | B1 | 1/2001 | Johnson |
| 6,188,519 | B1 | 2/2001 | Johnson |
| 6,238,830 | B1 | 5/2001 | Rangarajan et al. |
| 6,238,852 | B1 | 5/2001 | Klosner |
| 6,251,550 | B1 | 6/2001 | Ishikawa |
| 6,379,867 | B1 | 4/2002 | Mei et al. |
| 6,473,237 | B2 | 10/2002 | Mei |
| 6,717,650 | B2 | 4/2004 | Kain |
| 6,747,783 | B1 | 6/2004 | Sandstrom |
| 2002/0024714 | A1 | 2/2002 | Sandstrom et al. |
| 2003/0048427 | A1 | 3/2003 | Fernandez et al. |
| 2003/0084422 | A1 | 5/2003 | Chan |
| 2003/0179352 | A1 | 9/2003 | Van Der Mast |

FOREIGN PATENT DOCUMENTS

| | | |
|---|---|---|
| EP | 1 033 741 | 9/2000 |
| JP | 57017132 | 1/1982 |
| JP | 63086432 | 9/1986 |
| JP | 63196038 | 8/1988 |
| JP | 03030415 | 2/1991 |
| JP | 03034312 | 2/1991 |
| JP | 03174716 | 7/1991 |
| JP | 04042533 | 2/1992 |
| JP | 04192422 | 7/1992 |
| JP | 05029205 | 2/1993 |
| JP | 05190517 | 7/1993 |
| JP | 07022303 | 7/1993 |
| JP | 05259045 | 8/1993 |
| JP | 0 045906 | 7/1994 |
| JP | 06216006 | 8/1994 |
| JP | 08045908 | 2/1996 |
| WO | WO-9804950 | 2/1998 |
| WO | WO-9938187 | 7/1999 |

OTHER PUBLICATIONS

Gibbs, "New Chip Off the Old Block", Scientific American, Sep. 1996, online document, 3 pages.

Johnson, "Micromirror Arrays Perform Photolithography Step", EETIMES, 1999, online document, 5 pages.

Mendoza et al., "High-Throughput Microarray-Based Enzyme-Linked Immunosorbent Assay (ELISA)", Biotechniques, 1999, online document, 1 page.

Dobrowolski et al., "DNA Microarray Technology for Neonatal Screening", Acta Paediatr Suppl, 1999, online document, 1 page.

Nuwaysir et al., "Microarrays and Toxicology: the Advent of Toxicogenomics", Mol Carcinog, 1999, online document, 1 page.

Khan et al., "Expression Profiling in Cancer Using cDNA Microarrays", Electrophoresis, 1999, online document, 1 page.

Epstein et al., "Microarray Technology—Enhanced Versatility", Persistent Challenge, 2000, online document, 1 page.

Romero et al., "Reverse-Transcription Poylmerase Chain Reaction Detection of the Enteroviruses", Arch Pathol Lab Med, 1999, online document, 1 page.

Sellwood et al., "The Use of Reverse Transcriptase-Polymerase Chain Reaction to Investigate Environmental Samples for the Presence of Enteroviruses", Commun Dis Public Health, 1998, online document, 1 page.

Kurian et al., "DNA Chip Technology", J Pathol, 1999, online document, 1 page.

Ren et al., "Fabrication of Y-Gate, Submicron Gate Length GaAs Metal-Semiconductor Field Effect Transistors", Journal of Vacuum Science & Technology B, 1993, pp. 2603-2606, vol. 11, No. 6.

Martin et al., "Effects of Focused Ion Beam Reticle Repair on Optical Lithography at I-Line and Deep UltraViolet Wavelengths", Journal of Vacuum Science & Technology B, 1993, pp. 427-431.

Leming Shi, "DNA Microarray (Genome Chip)", website-www.GeneChips.com, 2002, 21 pages.

<http://www.envisiontec.de > www.envisiontec.de (Publication date on website is unknown.).

<http://www.micronic.se> www.micronic.se. Note that their micromirror technology is termed SLM technology (The link to this info is: http://www.micronic.se/site_eng/framesets/frame_products.html <http://www.micronic.se/site_eng/framesets/frame_products.html (Publication date on website in unknown.).

Lin et al., "An Improved Heterojunction-Emitter Bipolar Transistor Using Delta-Doped and Spacer Layers", Materials Chemistry and Physics, 1999, pp. 91-95, vol. 59, No. 1 (Abstract Only).

Genolet et al., "Soft, Entirely Photoplastic Probes for Scanning Force Microscopy", Review of Scientific Instruments, 1999, pp. 2398-2401, vol. 70, No. 5 (Abstract Only).

Sthel et al., "Testing a Furfuryl Alchohol Resin as a Negative Photoresist", Polymer Testing, 1999, pp. 47-50, vol. 18, No. 1 (Abstract Only).

Karafyllidis et al., "Modelling and Simulation", Microelectronic Engineering, 1999, pp. 71-84, vol. 45, No. 1 (Abstract Only).

Sekiguchi et al., "Influence of Underlayer Reflection on Optical Proximity Effects In Sub-Quarter Micron Lithography", Proceedings of the SPIE- The International Society for Optical Engineering, 1998, pp. 347-355 vol. 3334 (Abstract Only).

Maeda et al., "ArF Chemically Amplified Negative Resist Using Alicyclic Epoxy Polymer", Journal of Photopolymer Science and Technology, 1998, pp. 507-512, vol. 11, No. 3 (Abstract Only).

Kudo et al., "Optimization of DUV Negative Resists for 0.15 mu m Lithography", Journal of Photopolymer Science and Technology, 1998, pp. 445-454 vol. 11, No. 1 (Abstract Only).

Wallraff et al., "Etch Selectivity of 4SiMA:hydroxystyrene based copolymers. Silicon Chemistry for Bilayer Resist Systems", Journal of Photopolymer Science and Technology, 1998, pp. 673-679, vol. 11, No. 4 (Abstract Only).

Dabbagh et al., "Capabilities and Limitations of Plasma Polymerized Methylsilane (PPMS) All-Dry Lithography.", Journal of Photopolymer Science and Technology, 1998, pp. 651-661, vol. 11, No. 4 (Abstract Only).

Karafyllidis et al., "Negative Resist Profiles in 248 nm Photolithography: Experiment, Modelling and Simulation", Semiconductor Science and Technology, 1998, pp. 603-610, vol. 13, No. 6 (Abstract Only).

Robertson et al., "New Patternable Dielectric and Optical Materials for MCM-L/D- and o/e MCM-Packaging", Proceedings. The First IEEE International Symposium on Polymeric Electronics Packaging, 1997, pp. 203-212, (Abstract Only).

Hauouel et al., "Dependence of Developed Negative Resist Profiles on Exposure Energy Dose: Experiment, Modeling, and Simulation", Microelectronic Engineering, 1998, pp. 351-354, vol. 41-42 (Abstract Only).

Suzuki et al., "Proposal of Coplanar-type High-T/sub c/ Superconducting Field-effect Devices", Physica C, 1997, pp. 2495-2496, vol. 282-287 (Abstract Only).

Inanami et al., "50 nm Pattern Etching of Si Wafer By Synchrotron Radiation Excited CF/sub 4/plasma", Japanese Journal of Applied Physics, 1997, pp. 7706-7709, vol. 36, No. 12B (Abstract Only).

Yasuzato et al., "Optical Proximity Correction of Alternating Phase-Shift Masks for 0.18 mu m KrF Lithography", Proceedings of the SPIE, 1997, pp. 751-762, vol. 3051 (Abstract Only).

Op De Beeck et al., "NA/sigma Optimization Strategies for an Advanced DUV Stepper Applied to 0.25 mu m and sub-0.25 mu m Critical Levels", 1997, pp. 320-332, vol. 3051 (Abstract Only).

Hulsmann et al., "Edge-Phase-Shifting Lithography for sub 0.3 mu m T-Gates" Proceedings of the SPIE, 1997, pp. 295-303, vol. 3051 (Abstract Only).

Jungchul et al., "Measuring Flare and its Effect on Process Latitude", Proceedings of the SPIE, 1997, pp. 708-713, vol. 3051 (Abstract Only).

Guerin et al., "Simple and Low Cost Fabrication of Embedded Micro-Channels by Using a New Thick-Film Photoplastic", Tranducers 97, 1997, pp. 1419-22, vol. 2 (Abstract Only).

La Fontaine et al., "Characterization of SAL605 Negative Resist at Lambada =13 nm", OSA Trends ion Optics and Photonics, 1996, pp. 39-41, vol. 4 (Abstract Only).

Cha-Won Koh et al., "Characterization of the Resist Pattern Collapse in a Chemically Amplified Resist", Proceedings of the Microlithography Seminar INTERFACE '96, 1996, pp. 295-302 (Abstract Only).

Miller et al., "Getting the Most from I-Line Technology by Optimizing Numerical Aperture and Partial Coherence for Critical Layers", Proceedings of the Microlithography Seminar INTERFACE '96, 1996, pp. 269-278 (Abstract Only).

Katsumata et al., "Chemically Amplified Resist Process for 0.25 mu m Generation Photomasks", Proceedings of the SPIE, 1996, pp. 83-91, vol. 2884 (Abstract Only).

Lee-Soon Park et al., "Effect of Membrane Structure on the Performance of Field-Effect Transistor Potassium-Sensitive Sensor", Sensors and Actuators, 1996, pp. 239-243, vol. A57, No. 3 (Abstract Only).

Katsumata et al., "A Chemically Amplified Resist Process for 0.25 mu m Generation Photomasks", Proceedings of the SPIE, 1996, pp. 96-104, vol. 2793 (Abstract Only).

Wada et al., "New Concept for Negative Tone Electron Beam Resist", Proceedings of the SPIE, 1996, pp. 70-77, vol. 2793 (Abstract Only).

Flack et al., "An Investigation of the Properties of Photosensitive Polyimide Films", Proceedings of the SPIE, 1996, pp. 169-185, vol. 2726 (Abstract Only).

Op De Beeck et al., "Optical Proximity Effects and Correction Strategies for Chemical Amplified DUV Resists", Proceedings of the SPIE, 1996, pp. 622-633, vol. 2726 (Abstract Only).

Lin et al., "Water Soluble Resist for "Environmentally Friendly" Lithography", Proceedings of the SPIE, 1996, pp. 308-318, vol. 2725 (Abstract Only).

Nicolau et al., "Application of DNQ-Based Microlithography to Patterning Bioactive Molecules and Cells" Proceedings of the SPIE, 1996, pp. 500-511, vol. 2724 (Abstract Only).

Gabor et al., "Block and Random Copolymer Resists Designed for 193 nm Lithography and Environmentally Friendly Supercritical $CO_2$/Development", Proceedings of the SPIE, 1996, pp. 410-417, vol. 2724 (Abstract Only).

Huang et al., "A Negative Tone Resist System Using Vinyl Cyclic Acetal Crosslinker", Proceedings of the SPIE, 1996, pp. 315-322, vol. 2724 (Abstract Only).

Mori et al., "Investigation of Substrate-Effect in Chemically Amplified Resist", Proceedings of the SPIE, 1996, pp. 131-138, vol. 2724 (Abstract Only).

Vinet et al., "Undercut Elimination in DUV Negative Systems: Application to Lithography and Etching of Metal Levels", Proceedings of the SPIE, 1996, pp. 82-91, vol. 2724 (Abstract Only).

Kawahito et al., "Micro-Fluxgate Magnetic Sensing Elements Based on Silicon Microtechnology", Proceedings of the SPIE, 1996, pp. 134-137 (Abstract Only).

Larsen et al., "Design and Fabrication of Compliant Micromechanisms and Structures with Negative Poisson's Ratio", Proceedings IEEE, The Ninth Annual International Workshop on Micro Electro Mechanical Systems, 1996, pp. 365-371 (Abstract Only).

Yan et al., "DUV Wafer Processes", Proceedings of the SPIE, 1995, pp. 158-166, vol. 2621 (Abstract Only).

Suzuki et al., "Focused Ion Beam/Optical-Merged Lithographic Technique Using Ladder Silicone Spin-on Glass", Journal of Vacuum Science & Technology B, 1995, pp. 2593-2596, vol. 13, No. 6 (Abstract Only).

Arai et al., "Application of Chemically Amplified Resists to Photomask Fabrication", Proceedings of the SPIE, 1995, pp. 74-87, vol. 2512 (Abstract Only).

Farrar et al., "0.35 Microgram DUV Lithography for Poly Gate Layer", Proceedings of the SPIE, 1994, pp. 321-331, vol. 2196 (Abstract Only).

Pierre et al., "EDMES: an Expert System for Process Optimization in Micro-lithography", Proceedings of the SPIE, 1994, pp. 267-277, vol. 2196 (Abstract Only).

Op de Beeck et al., "Lithographic Strategies for 0.35 mu m Poly Gates for Random Logic Applications". Proceedings of the SPIE, 1994, pp. 407-421, vol. 2195 (Abstract Only).

Goethals et al., "Proximity Effects in Dry Developed Lithography for Sub-0.35 mu m Application", Proceedings of the SPIE, 1994, pp. 394-406, vol. 2195 (Abstract Only).

Nakano et al., "Transparent Photoacid Generator (ALS) for ArF Excimer Laser Lithography and Chemically Amplified Resist", Proceedings of the SPIE, 1994, pp. 194-204, vol. 2195 (Abstract Only).

Drozdov et al., "Quantum Wire With Controllable Conducting-Channel Width Based on IN/sub 0.53/Ga/sub 0.47/As/InP Heterostructures", Semiconductors, 1994, pp. 183-187, vol. 28, No. 2 (Abstract Only).

Tomo et al., "Process Issue Improvement of Surface Image Transfer Technique: Depth-of-Focus Characteristics and Their Comparison with Simulation Results", Journal of Vacuum Science & Technology B, 1993, pp. 2725-2732, vol. 11, No. 6 (Abstract Only).

Cullman, "Automatic Alignment System", Vortrage des 50. PTB Seminars Mikrometrologie Seminar, 1983, pp. 287-292 (Abstract Only).

Tanaka et al., "High-Precision Binary Optical Element Fabricated by Novel Self-Aligned Process", Japanese Journal of Applied Physics, 1999, pp. 6976-6980, vol. 38, No. 12B (Abstract Only).

Topper et al., "Low Cost Electroless Copper Metallization of BCB for High-Density Wiring Systems", Proceedings International Symposium on Advanced Packaging Materials, 1999, pp. 202-208 (Abstract Only).

Dietz et al., "The Process of Dry Film Lamination YPCB Manufacture", Printed Circuit Fabrication, 1999, pp. 42-45 vol. 22, No. 9 (Abstract Only).

Waldner, "Registration Concepts for Today's Multilayers YPCB Manufacture", Proceedings of the EPC, 1998, pp. 1-14 (Abstract Only).

Hoffman, "Photosensitive Dielectrics for New SBU-Technology YPCB Manufacture", Proceedings of the EPC, 1998, pp. 1-10 (Abstract Only).

Hertlein, "Performance and Limits of Photolithographic Technology: PCB Manufacturing Technology Following Microelectronics Production Technologies", Proceedings of the EPC, 1998, pp. 1-7 (Abstract Only).

Blake, "How Will Direct Imaging Affect AOI? YPCB Manufacture", CircuiTree, 1999, pp. 162,4,6 and 8, vol. 12, No. 3 (Abstract Only).

Gandhi et al., "HDI PCBs. I", Printed Circuit Fabrication, 1999, pp. 30, 32, 34, vol. 22, No. 3 (Abstract Only).

Copeland, "Impedance Control Accuracy YPCB Measurement", Printed Circuit Fabrication, 1999, pp. 26-28, 30, vol. 22, No. 2 (Abstract Only).

Weinhold et al., "PWB Laminates for High-Performance Applications", Electronic Packaging and Production, 1998, pp. 77-78, 80-81, vol. 38, No. 10 (Abstract Only).

Seyfert, "Dimensional Stability Characteristics YPCB Phototools", Printed Circuit Fabrication, 1998, pp. 62-63, vol. 21, No. 7 (Abstract Only).

Halevi et al., "Cost-Effective LDI YPCB Lithography", Printed Circuit Fabrication, 1998, pp. 30-31, vol. 21, No. 7 (Abstract Only).

Rittichier et al., "Laser Direct Imaging: A Strategic Inflection Point YPCB Manufacture", 1998, pp. 124, 126, 128, vol. 11, No. 6 (Abstract Only).

Ben-Ezra, "Meeting the Challenges of Direct Imaging for Cost-Effective Production YPCBs", 1998, pp. 108, 110, 112 vol. 11, No. 6 (Abstract Only).

Atiya, "An Innovative Laser Direct Imaging System YPCB Inner Layers", Circuitree, 1998, pp. 94, 96, 98, vol. 11, No. 6 (Abstract Only).

Raine, "Tenting: Cost Effective Fabrication of High-Density PWBs for the Year 200 and Beyond", Circuit World, 1998, pp. 6-10, vol. 24, No. 3 (Abstract Only).

Knudsen, "Using a New Photoimageable Dielectric for PWB Sequential Build-Up Technology", Proceedings. The First IEEE International Symposium on Polymeric Electronics Packaging, 1997, pp. 33-41 (Abstract Only).

Heath et al., "Microvias Buildup PWBs: Next Generation Substrates", SMTA National Symposium, 1997, pp. 1-9 (Abstract Only).

Brandt et al., "Ground and Power Planes for Impedance-Control and EMI Shielding in PCBs Made from Conductive TLPS Pastes", Proceedings of the Technical Conference, 1997, pp. S6/7/1-7 (Abstract Only).

Harris, "Zero Touch-Up YPCB Photolithography", Proceedings of the Technical Conference, 1997, pp. S5/5/1-5 (Abstract Only).

McGrath, "Multilayer PCB Manufacture Using a Permanent Photoresist—It Can Be Done", Proceedings of the Technical Conference, 1997, pp. S5/4/1-5 (Abstract Only).

Murray, "Laser Imaging Onto Dirtect-Write Film YPCB Manufacture", Proceedings of the Technical Conference, 1997, pp. S15/4/1-4 (Abstract Only).

Morrison, "TEA CO/sub 2/ Laser Micro Via Fabrication in Standard and Emerging PWB Dielectrics", Proceedings of the Technical Conference, 1997, pp. S15/3/1-7 (Abstract Only).

Siddhaye, "Integration of Environmental Factors in Process Modelling for Printed Circuit Board Manufacturing. II. Fabrication", Proceedings of the 1997 IEEE International Symposium on Electronics and the Environment, 1997, pp. 226-233 (Abstract Only).

Linn et al., "An Investigation on Artwork Image Mis-Alignment in Printed Circuit Board Manufacturing", 6th Industrial Engineering Research Conference Proceedings, 1997, pp. 696-701(Abstract Only).

Hu et al., "Cost Analysis for High Density Printed Wiring Board Manufacturing Processes", IPCWorks '96 Proceedings, 1996, pp. 1-5 (Abstract Only).

Jain et al., "High-Speed, High-Resolution Ylarge-Area PCB Exposure System", Printed Circuit Fabrication, 1997, pp. 34, 36, vol. 20, No. 5(Abstract Only).

Murray, "Direct Write Film YPCB Phototools", Printed Circuit Fabrication, 1997, pp. 24, 26-28, vol. 20, No. 5 (Abstract Only).

Brautigam et al., "Ultra-High Intensity Imaging YPCB Technology", Printed Circuit Fabrication, 1997, pp. 20-22 vol. 20, No. 5 (Abstract Only).

Chew et al., "Wastewater Recycling and Copper Recovery at a California PCB Shop", CircuiTree, 1997, pp. 132, 134, 136, 138, vol. 10, No. 5(Abstract Only).

Ho, "What's Up With SBU Technology? YPCB Sequential Build-Up", Printed Circuit Fabrication, 1997, pp. 64, 66, 68, vol. 20, No. 3 (Abstract Only).

Bergman, "Relieving the Points of Pain YPCB Data Transfer", Printed Circuit Fabrication, 1997, pp. 50, 52, 54, vol. 20, No. 3 (Abstract Only).

Singer et al., "Conventional Versus Build-Up PWB Fabrication: Cost Implications for Electronic Packaging", Proceedings of the 1996 International Electronics Packaging Conference, 1996, pp. 443-456 (Abstract Only).

Ben-Ezra et al., "Direct Imaging Comes of Age YPCB Lithography", CircuiTree, 1997, pp. 80, 82, 86, vol. 10, No. 3 (Abstract Only).

Miller et al., "Zero Wastewater Discharge YPCB Manufacture", Printed Circuit Fabrication, 1996, pp. 32, 34-36, vol. 19, No. 11 (Abstract Only).

Meiler et al., "New Photodielectric for the Sequential Build-Up (SBU) of High-Density Interconnect (HDI) PWB", Proceedings of the Printed Circuit World Convention VII, 1996, pp. PO08/1-2 (Abstract Only).

Lutschounig et al., "Buried Jumper Technology YPCBs", Proceedings of the Printed Circuit World Convention VII, 1996, pp. P16/1-11 (Abstract Only).

Wedeking, "Tooling Data Farm YPCB CAD/CAM", Proceedings of the Printed Circuit World Convention VII, 1996, pp. P4/1-5 (Abstract Only).

Tanizawa, "IBSS (R) IBased PCB Technology for High Pin Count/ Fine Pitch Package Assembly", Proceedings of the Printed Circuit World Convention VII, 1996, pp. P21/1-6 (Abstract Only).

Ohta, "Development of DVH-ADD Printed Wiring Board for High Density MCM", Proceedings of the Printed Circuit World Convention VII, 1996, pp. P21/1-6 (Abstract Only).

McGregor, "Effects of Copper Foil Type and Surface Preparation on Fine Line Image Transfer in Primary Imaging of Printed Wiring Boards", Proceedings of the Printed Circuit World Convention VII, 1996, pp. 17/1-20 (Abstract Only).

Vaughan et al., "Advances in Environmentally Conscious Manufacturing Through the Use of Permanent Photoimagable Materials in PWB Fabrication", Proceedings of the Printed Circuit World Convention VII, 1996, pp. S10/3/1-5 (Abstract Only).

Conrod et al., "PhotoDefinable Dielectric Materials for High Density Printed Wiring Board Applications", Proceedings of the Technical Conference IPC Printed Circuits EXPO, 1996, pp. S8/5/1-6 (Abstract Only).

Nakahara et al., "Review of the Current Status of Laser Direct Imaging YPCB Manufacture", Proceedings of the Technical Conference IPC Printed Circuits EXPO, 1996, pp. S8/1/1-3 (Abstract Only).

Aday et al., "A Comparative Analysis of High Density PWB Technologies", Proceedings of the SPIE, 1996, pp. 239-244, vol. 2794 (Abstract Only).

Holden, "Comparing Costs for Various PWB Build-Up Technologies YMCM-L", 1996, pp. 15-21, vol. 2794 (Abstract Only).

Eickmans, "Mastertool: A New Dry Phototool in the Production of Printed Circuit Boards", Circuit World, 1996, pp. 26-32, vol. 22, No. 3 (Abstract Only).

Crum, "Imaging Technology: Today, Tomorrow and Beyond YPCB Manufacture", Electronic Packaging and Production, 1996, vol. 36, No. 3 (Abstract Only).

Layden, "Is Photoplotting Finally Seeing the Light? II. YPCB Design", Printed Circuit Design, 1995, pp. 27-28, vol. 12, No. 12 (Abstract Only).

Ohlig, "Lighting Equipment and Fine-Line Production YPCB Lithography", Printed Circuit Fabrication, 1996, pp. 32-33, vol. 19, No. 1 (Abstract Only).

Frauzem, "Increasing Productivity YPCB Lithography", Printed Circuit Fabrication, 1996, pp. 26-28, vol. 19, No. 1 (Abstract Only).

Nakamura et al., "High Realiability, High Density Build Up Printed Circuit Board for MCM-L", Proceedings 1995 International Conference on Multichip Modules (SPIE), 1995, pp. 36-41, vol. 2575 (Abstract Only).

Layden, "Is Photoplotting Finally Seeing the Light? I. YPCB Design", Printed Circuit Design, 1995, pp. 16-17 (Abstract Only).

Yoshiki et al., "Pattern Formation of Cu Layer By Photocatalytic Reaction of ZnO Thin Film Y Printed Circuit Boards", Journal of the Electrochemical Society, 1995, pp. L235-L237, vol. 142, No. 12 (Abstract Only).

Dietz, "Fine Line Imaging (PCB Photolithography)", Printed Circuit Fabrication, 1995, pp. 32, 34, 36, vol. 18, No. 10 (Abstract Only).

Bridges, "Fine-Line Imaging. (PCB Manufacture)", Printed Circuit Fabrication, 1995, pp. 34, 36-38, vol. 18, No. 7 (Abstract Only).

Schillhammer, "Rapid Multi-Layer PCB Prototyping in an Engineering Lab Environment", Proceedings of the Technical Program. National Electronic Packaging and Production Conference, 1994, pp. 49-52 (Abstract Only).

Soules, "Dissecting Film Defects (PCB Manufacture, Imaging Contamination)", Printed Circuit Fabrication, 1994, pp. 26, 28, vol. 17, No. 12 (Abstract Only).

Layton, "Gerber Basics: A PCB Primer-What is the Gerber Format, and Why Do I Need It?", Printed Circuit Fabrication, 1994, pp. 30-32, vol. 16, No. 7 (Abstract Only).

Bowls et al., "Illuminating Imaging (PCB)", Printed Circuit Fabrication, 1993, pp. 40-41, vol. 16, No. 5 (Abstract Only).

Timmons, "Imaging Large High Performance Printed Wiring Boards", Surface Mount International Conference and Exposition. Proceedings of the Technical Program, 1992, pp. 543-546, vol. 1 (Abstract Only).

Kimura et al., "Mass-Production of PWBs With 5 Track Technology", NEC Technical Journal, 1993, pp. 77-81, vol. 45, No. 9 (Abstract Only).

Shawhan et al., "Plated Copper Ceramic PWBs: a Versatile Metallization Technology", Hybrid Circuit Technology, 1992, pp. 28-33, vol. 8, No. 12 (Abstract Only).

Venkata, "Industrial Fabrication of Printed Circuit Boards", Electrical India, 1990, pp. 13-1, vol. 30, No. 23 (Abstract Only).

Rust, "Plasma cleaning of lands to improve bonding of surface mount components to printed wiring boards", IEPS, Proceedings of the Technical Conference, 1990, pp. 95-109 (Abstract Only).

Lozano, "Phototools are Developing the Future of PCBs", Electronic Packaging and Production, 1990, pp. 42-44, vol. 30, No. 12 (Abstract Only).

No-Author, "The Production of PCBs Using Pre-Sensitized Base Material", Revista Espanola De Electronica, 1990, pp. 36-38, No. 427 (Abstract Only).

Weinhold, "Solder-Stopping Masks for Printed Circuit Boards", Elektronik Praxis, 1990, pp. 30-33, vol. 25, No. 15 (Abstract Only).

Berry, A Fabricator's Experience With a Curtain Coatabe PILSM with SMT type PWBs, 1990, pp. 731-738, vol. 1 (Abstract Only).

Pavese et al., "The Three Dimensions made in Italy (PCBs)" Elettronica Oggi, 1990, pp. 160-172, No. 90 (Abstract Only).

Mougin et al., "Magnetic Micropatterning of FeNi/FeMn Exchange Bias Bilayers By Ion Irradiation", Journal of Applied Physics, 2001, pp. 6606-6608, vol. 89, No. 11 (Abstract Only).

Guo et al., "Use of MicroFabricated Cold Field Emitters in Sub-100 nm Maskless Lithography", Journal of Vacuum Science & Technology, 2001, pp. 862-865, vol. 19, No. 3 (Abstract Only).

Menon et al., "Zone-Plate-Array Lithography (ZPAL): Simulations for System Design", AIP Conference Proceedings, 2000, pp. 647-652, No. 507(Abstract Only).

Ishibashi et al., "Combining Atomic Force Microscopic Lithography with Photolithography". Japanese Journal of Applied Physics, 2000, pp. 7060, vol. 39, No. 12B (Abstract Only).

Parker et al., "A High Throughput NGL Electron Beam Direct-Write Lithography System", Proceedings of the SPIE, 2000, pp. 713-720, vol. 3997 (Abstract Only).

Dai et al., "Lossless Layout Compression For Maskless Lithography System", Proceedings of the SPIE, 2000, pp. 467-477, vol. 3997 (Abstract Only).

Luo Xian-Gang, "Nanolithography Technology", Wuli, 2000, pp. 358-363, 350, vol. 29, No. 6 (Abstract Only).

Parker et al., "A High Throughput Electron-Beam Direct-Write Lithography System", Microlithography World, 2000, pp. 22, 24-25, 30, vol. 9, No. 3(Abstract Only).

Lakner et al., "Micromirrors For Direct Writing Systems and Scanners", Proceedings of the SPIE, 1999, pp. 217-227, vol. 3878 (Abstract Only).

Higgins et al., "Anisotropic Spinodal Dewetting as a Route to Self-Assembly of Patterned Surfaces", Nature, 2000, pp. 476-478, vol. 404, No. 6777 (Abstract Only).

Polesello et al., "Micromachining of Silicon With a Proton Microbeam". Nuclear Instruments & Methods in Physics Research, 1999, pp. 173-178, vol. 158, No. 1-4 (Abstract Only).

Carter et al., "Maskless, Parallel Paterning With Zone-Plate Array Lithography", Journal of Vacuum Science & Technology, 1999, pp. 3449-3452, vol. 17, No. 6 (Abstract Only).

Carter et al., "Zone-Plate Array Lithography (ZPAL): A New Maskless Approach", Proceedings of the SPIE, 1999, pp. 324-332, vol. 3676 (Abstract Only).

Watjen et al., "On the Interpretation of Micro-PIXE Measurements on a Prototype Microstructured Reference Material", Nuclear Instruments & Methods in Physics Research, 1999, pp. 532-537, vol. 150, No. 1-4 (Abstract Only).

Pueker et al., "High Resolution Phase Zone Plates for Water Window Wavelengths", Proceedings of the SPIE, 1998, pp. 118-128, vol. 3449 (Abstract Only).

Groves et al., "Distributed, Multiple Variable Shaped Electron Beam Column for High Throughput Maskless Lithography", Journal of Vacuum Sciences, 1998, pp. 3168-3173, vol. 16, No. 6 (Abstract Only).

Fuller et al., "Photomask Edge Roughness Characterization Using an Atomic Force Microscope", Proceedings of the SPIE, 1998, pp. 433-440, vol. 3332 (Abstract Only).

Descour et al., "Mass-Producible Microtags for Security Applications: Calculated Fabrication Tolerances By Rigorous Coupled-Wave Analysis", Optical Engineering, 1998, pp. 1254-1261, vol. 37, No. 4 (Abstract Only).

Avramescu et al., "Atomic Force Microscope Lithography on Carbonaceous Films Deposited by Electron-Beam Irradiation", Applied Physics Letters, 1998, pp. 716-718, vol. 72, No. 6 (Abstract Only).

Trau et al., "Microscopic Patterning of Orientated Mesoschopic Silia Through Guided Growth", Nature, 1997, pp. 674-676, vol. 390, No. 6661 (Abstract Only).

Descour et al., "Mass-Producible Microtags for Security Applications: Tolerance Analysis by Rigorous Coupled-Wave Analysis", Proceedings of the SPIE, 1997, pp. 15-24, vol. 3009 (Abstract Only).

Graham et al., "Conducting Polyaniline Coatings For Submicron Lithography and SEM Technology", Proceedings of the SPIE, 1997, pp. 105-113, vol. 3048 (Abstract Only).

Sweatt et al., "Mass-Producible Microtags", OSA Trends in Optics and Photonics, 1996, pp. 212-214, vol. 4 (Abstract Only).

Matsuo et al., "Investigations on Reaction Mechanisms in a Surface Modification Resist Process Using Chemical Vapor Deposition of Polysiloxane", Journal of Electrochemical Society, 1997, pp. 2903-2909, vol. 144, No. 8 (Abstract Only).

No-Author, "Atom Optics", Proceedings of the SPIE, 1997, vol. 2995 (Abstract Only).

Biebuyck et al., "Lithography Beyond Light: Microcontact Printing with Monolayer Resists", IBM Journal of Research and Development, 1997, pp. 159-170, vol. 41, No. 1-2 (Abstract Only).

Terris et al., "Nanoscale Replication for Scanning Probe Data Storage", Applied Physics Letters, 1996, pp. 4262-4264, vol. 69. No. 27 (Abstract Only).

Descour et al., "Mass-Producible Microscopic Computer-Generated Holograms: Microtags", Optics Letters, 1996, pp. 1951-1953, vol. 21, No. 23 (Abstract Only).

Ishikawa et al., "Nanometer-Scale Pattern Formation of GaAs by In Situ Electron-Beam Lithography Using Surface Oxide Layer as a Resist Film", Journal of Vacuum Science, 1995, pp. 2777-2780, vol. 13, No. 6 (Abstract Only).

Dz-Chi et al., "Computer Simulations For Mask Structure Heating in X-Ray Lithography", Computers and Structures, 1996, pp. 825-834, vol. 58, No. 4 (Abstract Only).

Takechi et al., "Effects of Electron Beam Irradiation on Highly Oriented Poly (di-methyl silane) Film", Journal of Physics D, 1995, pp. 535-538, vol. 28, No. 3 (Abstract Only).

Ruokamo et al., "H/sub 2/S Response of WO/sub 3/ Thin-Film Sensors Manufactured by Silicon Processing Technology", Sensors and Actuators B (Chemical), 1994, pp. 486-488, vol. B19, No. 1-3 (Abstract Only).

Trippe et al., "Sychrotron Beamless For X-Ray Lithography", Proceedings of the SPIE, 1994, pp. 314-319, vol. 2045 (Abstract Only).

Scheckler et al., "Simulation of AZ-PN100 Resist Pattern Fluctuation in X-Ray Lithography, Including Synchrotron Beam Polarization", Japanese Journal of Applied Physics, 1993, pp. 5951-5959, vol. 32, No. 12B (Abstract Only).

Schmidt et al., "Wafer Process-Induced Distortion Study for X-Ray Technology", Journal of Vacuum Science, 1991, pp. 3237-3240, vol. 9, No. 6 (Abstract Only).

Wilkinson, "Dry Etch Damage and its Effect on Electronic and Optical Nanostructures", Superlattices and Microstructures, 1990, pp. 381-386, vol. 7, No. 4 (Abstract Only).

Mescheder, "Investigation of Linewidth Uniformity in X-Ray Lithography", 1989, pp. 396-440, vol. 1087 (Abstract Only).

Shiokawa, "Microfabrication Technologies by Focused Ion Beam", 1989, pp. 274-278, vol. 55, No. 2 (Abstract Only).

Shimazu et al., "High Speed Electron Beam Lithography", Journal of the Japan Society of Precision Engineering, 1987, pp. 1682-1686, vol. 53, No. 11 (Abstract Only).

METHOD AND APPARATUS FOR MASKLESS PHOTOLITHOGRAPHY

CROSS-REFERENCE TO A RELATED APPLICATION

The present application is a divisional application of U.S. application Ser. No. 10/408,696, filed Apr. 7, 2003, which is a continuation-in-part of U.S. patent application Ser. No. 10/179,083, filed on Jun. 25, 2002 now U.S. Pat. No. 6,544,698, and a continuation-in-part of U.S. patent application Ser. No. 10/179,565, filed on Jun. 25, 2002 now U.S. Pat. No. 6,998,219, both of which claim priority to U.S. Provisional Application Ser. No. 60/301,218, filed Jun. 27, 2001, all of which are hereby incorporated by reference herein in their entirety, including any figures, tables, or drawings.

The subject invention was made with government support under a research project supported by The Office of Naval Research funding reference number NOO014-98-1-0848. The government has certain rights in this invention.

BACKGROUND ART

Photolithography systems are known in the art that direct light beams onto a photosensitive surface covered by a mask, etching a desired pattern on the substrate corresponding to the void areas of the mask. Maskless photolithography systems are also known in the art as described in Singh-Gasson, Sangeet et al., *Nature Biotechnology* 17, 974-78, 1999. The system described in this article uses an off-axis light source coupled with a digital micromirror array to fabricate DNA chips containing probes for genes or other solid phase combinatorial chemistry to be performed in high-density microarrays.

A number of patents also exist which relate to maskless photolithography systems, including U.S. Pat. Nos. 5,870,176; 6,060,224; 6,177,980; and 6,251,550; all of which are incorporated herein by reference. While the previously described maskless photolithography systems address several of the problems associated with mask based photolithography systems, such as distortion and uniformity of images, problems still arise. Notably, in environments requiring rapid prototyping and limited production quantities, the advantages of maskless systems as a result of efficiencies derived from quantities of scale are not realized. Further, prior art references lack the ability to provide rapid prototyping.

In particular, alignment of patterns with respect to target substrates in maskless systems can be problematic. Various solutions have been proposed to mitigate the effect of alignment problems, including the digital shifting of the projected mask pattern to compensate for misalignment of a substrate. However, this technique requires that the substrate be closely aligned initially and is better suited for high volume production runs which incorporate automatic initial alignment systems. In a rapid prototyping, limited quantity environment, automated means of initial alignment are not cost effective.

In addition, conventional maskless alignment systems are normally limited to coplanar, two-dimensional alignment. However, there is a need in the art to create three-dimensional patterns on substrates. Creating three-dimensional patterns requires further alignment of the substrates in a third dimension perpendicular to the two coplanar dimensions. In the third dimension, computerized shifting of the mask pattern cannot compensate for misalignments in a direction parallel with an incident light beam. As a result, an ability to align a substrate in a third dimension in a rapid prototyping, reconfigurable environment is needed.

Another problem with maskless photolithography systems is that the mask pattern image projected is formed by pixels, instead of continuous lines. As a result, gaps may exist between adjacent pixels, which, when projected on a substrate, may allow the area between the pixels to be exposed, resulting in a break in the imaged pattern. For example, if the desired pattern is a circuit, gaps may be inadvertently exposed and formed in a trace, resulting in an electrical gap. The exposure gaps caused by the pixel nature of the micromirror arrays, or pixelation, may cause open circuits or unwanted capacitive effects where trace width or thickness is critical.

Another problem with current art systems is the phenomenon of "stiction," wherein the individual mirrors in a micromirror area tend to "stick" in a specific orientation if left in that position for an extended period. Consequently, a higher voltage needs to be applied to the mirror drive to point the mirror in another desired direction. Thus the micromirror array consumes more power than normal and affects the reliability of the mirror.

It is known in the art to use gray scale masks in photolithography to form continuously variable material profiles on substrates, such as microlens arrays (wherein each lens can have a different profile), refractive and diffractive micro-optics, precision tapered structures, sinusoidal transmittance gratings, arbitrary shaped micro-optics, and other 3D micro-structures, including optical micro-electromechanical devices (MEMS). One type of gray scale mask is a halftone chrome mask that consists, for example, of mixtures of 0.5 micron×0.5 micron chrome spots which are totally opaque and 0.5 micron×0.5 micron clear spots which are totally transparent due to the absence of chrome film coating on the glass photomask substrate. The transmittance of a gray scale resolution element in a halftone chrome mask is determined by the ratio of the number of chrome spots to clear spots. Transmittance decreases as the ratio of chrome spots to clear spots is increased. For a gray scale chrome mask capable of 16 gray levels, a gray scale resolution element must consist of 16 binary spots. A binary spot of the chrome mask is either a chrome spot or a clear spot. When all 16 binary spots in a gray scale resolution element are chrome spots, the gray scale resolution element is totally opaque. However, the images produced using this method are halftone images, not true gray scale images.

Gray scale masks have also been implemented in a photo-emulsion film or a photographic emulsion glass plate and are halftone gray scale patterns, since each silver grain in a developed photographic emulsion is totally opaque. The gray scale is produced by varying the number density of the silver grains. The spacing between the grains are transparent. The size of silver grains is not uniform and may range from, for example, about 0.1 micron to about 1 micron in a high-resolution photoemulsion plate. Therefore, it is difficult to obtain consistent imaging results because of the nonuniformity of grain size.

Yet another type of gray scale is the High Energy Beam Sensitive (HEBS) glass, manufactured, for example by Canyon Material, Inc. In the HEBS glass, process glass photomasks having varying transmissive properties are created in photosensitive glass according to the energy density of a high energy beam impinging on the glass surface. The resulting varying transmissibility glass substrate is used as a gray scale photomask in standard photolithographic processes to create micro-optical elements such as refractive micro lens arrays, diffractive optical elements, prism couples, and three-dimensional microstructures.

Although the HEBS glass process allows true gray scale imaging, a photomask must still be used for photolithographic processing of substrates. While effective, the use of physical masks in photolithography has numerous drawbacks, including the cost of fabricating masks, the time required to produce the sets of masks needed to fabricate semiconductors, the diffraction effects resulting from light from a light source being diffracted from opaque portions of the mask, registration errors during mask alignment for multilevel patterns, color centers formed in the mask substrate, defects in the mask, the necessity for periodic cleaning and the deterioration of the mask as a consequence of continuous cleaning.

It also known in the art to use maskless gray scale x-ray lithography. Maskless gray-scale x-ray lithography has been disclosed (Frank Hartley, Maskless Gray-Scale X-ray Lithography, NASA Tech Brief # NPO-20445, July, 2000). In this reference, a photoresist coated substrate to be patterned is exposed to a parallel beam of hard x-rays. The photoresist is translated across the beam at a varying rate to effect one-dimensional spatial variations in the radiation dose received by the photoresist. The radiation dose delivered to the photoresist on a substrate is made to vary spatially, within a range in which the solubility of the exposed photoresist in a developer liquid varies with the dose.

In conventional gray-scale x-ray lithography, the required spatial variation in the dose is achieved by use of a mask. The mask and the photoresist-covered substrate are translated as a unit across an x-ray beam at a constant rate to obtain the required integrated dose to the mask. In the disclosed maskless technique, the photoresist is not masked. The gradients in the radiation dose needed to obtain gradients in the density of the developed photoresist are generated by controlled variations in the rate of translation of the x-ray beam across the photoresist. These controlled variations define the desired features (variations of the height of the subsequently developed photoresist) to within sub-micron dimensions, depending on the exposure time of the substrate.

After exposure to x-rays, the photoresist coated substrate is developed in the customary manner. After development, the photoresist is dried, giving rise to spatial consolidation of the photoresist into thickness gradients corresponding to the density gradients. The dosage gradients are chosen to achieve desired final thickness gradients, for example, to produce triangular- or saw tooth-cross-section blazes for diffraction gratings. However, the x-rays are inherently dangerous and their use is highly regulated, requiring sophisticated equipment to generate and direct the radiation. In addition, the disclosed techniques require complex translational stages to expose and generate patterns on substrates.

In addition, it is also known in the art to use lasers to create patterns on large photoresist coated substrates. In particular, as disclosed in R. Bawn, et al., "Micromachining System Accommodates Large Wafers," Laser Focus World, January 2001, pp. 189-192, and "Laser Microfabrication Process," Proceedings of ICALEO 2000, Paper A49, October 2000, laser lithography techniques can be used to create patterns on large substrates. In the disclosed systems, laser-micromachining systems for large area patterning require a laser source, optics for conditioning and focusing the beam, and a way to precisely control and point the beam. Patterns are produced on substrates by precisely positioning and focusing the laser beam over small area and ablating away the substrate material to form a desired pattern, The laser is then repositioned and another area of the substrate is ablated. The process is continued until the desired pattern on a substrate has been created. In this manner a large substrate can be sequential processed to create large patterned substrates. However, only small areas can be written at one time because of the small beamwidth of the laser, making large area patterning prohibitively time consuming.

Accordingly, there is a need in the art for a method and system for maskless photolithography to provide a more effective way to fabricate custom devices in a low volume production environment. This system needs to combine ease of use, reconfigurability, and the ability to provide coarse manual alignment and automated fine alignment of mask patterns. In addition the system needs to address the exposure gaps inherent in the process due to the pixel nature of the projected mask and provide means for eliminating stiction. In summary, the system needs to provide all the advantages of a maskless photolithography system at a reasonable cost, and include capabilities tailored to direct writing in a rapid prototyping environment.

In addition, there is a need in the art for a method and system for maskless photolithography to provide gray scale capability and large area patterning of substrates. This system can combine ease of use, reconfigurability, and the ability to provide gray scale patterns to create variable thickness on exposed substrates. In addition the system can allow patterning large areas in a single exposure. The system can provide many of the advantages of a maskless photolithography system at a reasonable cost, and include capabilities tailored to gray scale imaging and large area pattern generation in a cost effective, easy to implement system.

SUMMARY OF THE INVENTION

In view of the foregoing deficiencies of the prior art, it is an object of the present invention to provide a maskless photolithography system for creating 2-D and 3-D patterns on substrates.

It is another object of the present invention to provide an easy to use, reconfigurable, rapid prototyping maskless photolithography system.

It is still another object of the present invention to provide a directly coupled optical system for maskless photolithography that ensures efficient transfer of light energy to a substrate for performing photolithography.

It is yet another object of the present invention to provide a projected image for maskless photolithography that is free from distortion and uniform throughout the exposure area.

It is still another object of the present invention to provide a positioning fixture, selectively movable in three dimensions to accurately position a substrate for maskless photolithography.

It is another object of the present invention to provide a maskless photolithography for creating micro and macro three-dimensional structures.

It is another object of the present invention to provide gray scale patterning using a maskless photolithography system.

To achieve these objects, a system and method are provided to create two dimensional and three dimensional structures using a maskless photolithography system that is directly reconfigurable and does not require masks, templates or stencils to create each of the planes or layers on a multi layer two-dimensional or three dimensional structure. In an embodiment, the invention uses a micromirror array comprising up to several million elements to modulate light onto a substrate that has photoreactive compounds applied to the exposed surface. The desired pattern is designed and stored using conventional computer aided drawing techniques and is used to control the positioning of the individual mirrors in the micromirror array to reflect the corresponding desired pattern. Light impinging on the array is reflected to or directed away from the substrate to create light and dark spots on the substrate according to the pattern. In addition, an alignment fixture, movable in three dimensions, for mounting of the substrate is provided. The alignment fixture allows the affixed substrate to be moved in three dimensions, providing alignment in two, coplanar dimensions and a third dimension perpendicular to the two coplanar dimensions. By providing alignment in the third dimensional direction, the invention advantageously provides the capability to produce three-dimensional structures on a substrate. Further, the positioning information provided to the micromirror array can be modulated to cause the individual mirrors to change their angular position during exposure to reduce the effects of pixelation and stiction and/or produce gray scale patterns. Further, the subject invention can be used to produce large scale patterning on, for example, substrates.

The advantages of the invention are numerous. One significant advantage is the ability to use the invention as a reconfigurable, rapid prototyping tool for creating two-dimensional and three dimensional micro and macroscopic objects. Another advantage of the invention is that it provides the ability to reduce prototyping costs and enable devices to be fabricated more quickly with less risk. Yet another advantage of the invention is the ability to utilize different designs and operating conditions on a single device. A further advantage is the ability to use computer network to transfer designs across networks for immediate light exposure of a substrate. Still another advantage of the current invention is a reduction in cost for prototyping activities realized by the elimination of physical masks and the ability to create both positive and negative tone images using the same array. Yet another advantage of the current invention is that pattern generation can be performed optically without having to use expensive vacuum system required by conventional mask—based photolithography. A particular advantage of the current invention is the ability to create three-dimensional devices using an alignment stage to selectively expose successive layers in a substrate. By modulating the movement of the micromirror arrays, the negative effects of pixelation and stiction of micromirrors is reduced.

The subject invention can allow the ability to photoform continuously variable pattern thickness on substrates by using the disclosed gray scale lithographic techniques that do not have a gray scale mask as an element in the gray scale lithographic system. Another advantage of the invention is the ability to efficiently create patterns on larger areas than conventionally possible.

By providing the ability to individually control the individual micromirrors of the mirror array, any arbitrary micro or macroscopic structure can easily and quickly be created in substrates such as polymers, metals, or ceramics. Patterns such as glasses, microfluidic networks, thin film devices, hybrid material devices, micro electromechanical machines (MEMs), photomasks and combinations of the above mentioned devices can be created using the reconfigurable, application specific photolithography system disclosed.

All patents, patent applications, provisional applications, and publications referred to or cited herein, or from which a claim for benefit of priority has been made, are incorporated herein by reference in their entirety to the extent they are not inconsistent with the explicit teachings of this specification.

Other aspects and advantages of the invention will become apparent from the following detailed description taken in conjunction with the accompanying drawings, illustrating, by way of example, the principles of the invention.

BRIEF DESCRIPTION OF THE DRAWINGS

In order that the manner in which the above recited and other advantages and objects of the invention are obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

Figure 1A:
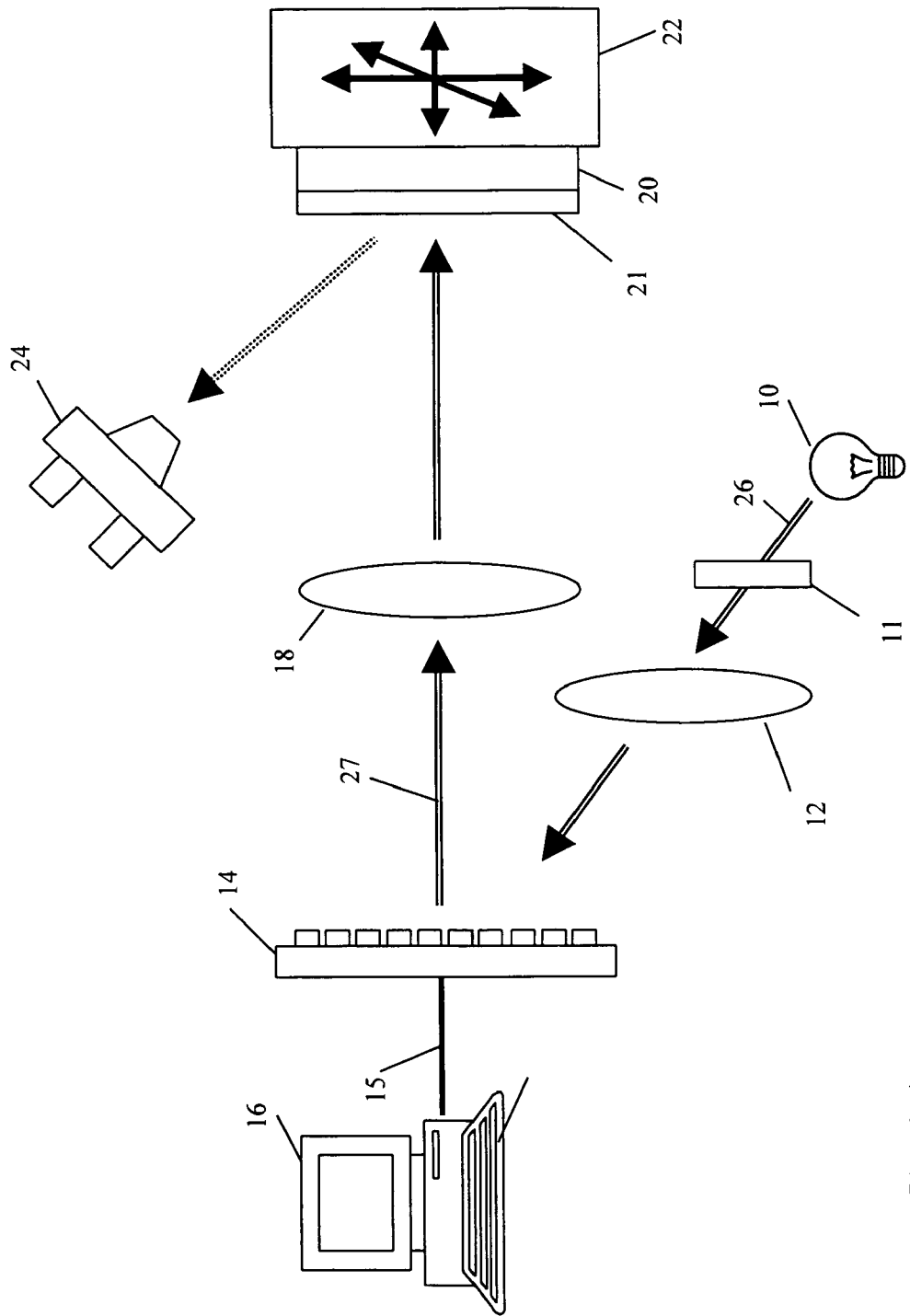
FIG. 1A illustrates a maskless photolithography system according to an embodiment of the present invention.

It should be understood that in certain situations for reasons of computational efficiency or ease of maintenance, the ordering and relationships of the blocks of the illustrated flow charts could be rearranged or re-associated by one skilled in the art. While the present invention will be described with reference to the details of the embodiments of the invention shown in the drawings, these details are not intended to limit the scope of the invention.

DETAILED DISCLOSURE OF THE INVENTION

References will now be made in detail to the embodiments consistent with the invention, examples of which are illustrated in the accompanying drawings. First, briefly, the invention is a system and method to create two dimensional and three dimensional structures using a maskless photolithography system comprising a maskless pattern generator that is directly reconfigurable and does not require masks, templates or stencils to create each of the planes or layers on a multi layer two-dimensional or three dimensional structure. In an embodiment, the invention uses a micromirror array comprising up to several million elements to modulate light onto a substrate that has photoreactive or photoresist compounds applied to the exposed surface. The desired pattern is designed and stored using conventional computer aided drawing techniques and is used to control the positioning of the individual mirrors in the micromirror array to reflect the corresponding desired pattern. Light impinging on the array is reflected to or directed away from the substrate to create light and dark spots on the substrate according to the desired pattern. In addition, an alignment fixture for mounting of the substrate allows the substrate to be moved in three dimensions, providing alignment in two, coplanar dimensions and the capability to produce three dimensional structures by aligning the substrate in a third dimension perpendicular to the two coplanar dimensions.

The subject invention can provide a system and method for photoforming photosensitive materials using maskless, gray scale photolithography system. In addition, the invention provides a directly coupled optical system for large area patterning using a maskless photolithography system.

In a specific embodiment, the alignment fixture for mounting of the substrate can incorporate a means for positioning the aligned fixture and, therefore, the substrate, in one, two, or three dimensions. In a specific embodiment, the means for positioning the alignment fixture can be interconnected with the system for controlling the positioning of the individual mirrors in the micromirror array, such that the system can also control the movement of the substrate in one, two, or three dimensions. This can allow the system to coordinate the control of the position of micromirrors and control of the position of the substrate to accomplish the desired mask pattern. In a further specific embodiment, the alignment fixture can incorporate a means for allowing rotation of the substrate in one, two, or three directions. The means for allowing rotation of the substrate can be interconnected with the system for controlling the positioning of the individual mirrors in the micromirror array, such that the system can also control the rotation of the substrate in one, two, or three directions. This can allow the system to coordinate the control of the position of the micromirrors and the rotation of the substrate to accomplish the desired mask pattern. The system can also be allowed to coordinate the control of the position of the micromirrors, the movement of the substrate, in one, two, or three dimensions, and the rotation of the substrate in one, two, or three directions to accomplish the desired mask pattern. In another specific embodiment, movement of the micromirror array 14 in one, two, or three dimensions and/or rotation of micromirror array 14 in one, two, or three directions can be accomplished. Such movement and/or rotation of micromirror array 14 can be accomplished by interconnected computer system 16 with the means to accomplish the movement and/or rotation. Accordingly, the computer system can coordinate the movement and/or rotation of the substrate and the movement and/or rotation of micromirror array 14 to accomplish the desired mask pattern.

I. Maskless Photolithography System

Referring now to FIG. 1A, an embodiment of the current invention includes a light source 10, a removable filter 11, a first lens system 12, a micromirror array 14, a computer system 16, a second lens system 18, a substrate 20, mounted on a movable alignment fixture 22, and an optical viewer 24. A layer of photoreactive chemicals 21 is disposed on the substrate 20. It should be understood that the invention is not limited to the use of a substrate 20 having a layer of photoreactive chemicals 21. Any photoreactive material, such as a photoreactive substrate, may be used in conjunction with the invention to photoform objects by patterned light exposure.

As shown, light source 10 provides a beam of collimated light, or light beam 26, which can be selectively filtered by inserting or removing filter 11 from light beam 26. Light beam 26 is projected upon first lens system 12 and then onto micromirror array 14, wherein each mirror in the micromirror array corresponds to a pixel of the mask pattern. Micromirror array 14 is controlled by computer system 16 over signal line(s) 15 to reflect light according to a desired mask pattern stored in memory. In addition, computer system 16 can shift the desired mask pattern in two dimensions to align the pattern with the substrate 20 mounted on movable alignment fixture 22. Precise pattern alignments are optionally made electronically by shifting the mask pattern information provided to the micromirror array such that the image, or pattern, reflected to the substrate is translated to correct for misalignment. For example, if the mask pattern needs to be shifted to the right one pixel width to be properly aligned on the substrate, the computer compensates for the misalignment by shifting the mask pattern one pixel width to the right.

In an embodiment, micromirror array 14 is controlled to modulate the positioning of the mirror to prevent stiction and pixelation. The individual mirrors of micromirror array 14 are driven to vary their angular orientation with respect to on-axis illumination during exposure of a substrate. The light beam 26 incident on the micromirror array is reflected as a patterned light beam 27 by reflecting or orienting the desired pixels toward the substrate 20, and reflecting or orienting the undesired pixels away from the substrate 20. After being reflected in a desired pattern from micromirror array 14, patterned light beam 27 passes through second lens system 18, and impinges on a layer of photoreactive chemicals 21 applied to substrate 20, thereby creating a pattern on substrate 20 by producing a reaction between the layer of photoreactive chemicals 21 and substrate 20 and/or producing a photo-reaction in the layer of photoreactive chemicals on the substrate 20. Alternatively, a photoresist chemical could be applied to substrate 20 to etch areas of substrate 20 not masked off by the mask pattern during an exposure.

The mask pattern described above is a programmable mask pattern generated with the use of computer aided design and is resident on computer system 16. Accordingly, the mask pattern to be transferred to the layer of photoreactive chemicals 21 and substrate 20 is a selectively programmable mask pattern. Thus, with a programmable mask pattern, any portion of the pattern on the substrate 20 can be manipulated and/or changed as desired for rendering of desired changes as may be needed, furthermore, on a significantly reduced cycle time.

Micromirror array 14 described above is a micro mirror device known in the art. With the micro mirror device, light is reflected according to a pattern of pixels as controlled according to a prescribed pixel/bit mask pattern received from computer system 16. The light reflecting from the micro mirror device thus contains the desired mask pattern information. A micro mirror device may include any suitable light valve, for example, such as that used in projection television systems and which are commercially available. Light valves are also referred to as deformable mirror devices or digital mirror devices (DMD). One example of a DMD is illustrated in U.S. Pat. No. 5,079,544 and patents referenced therein, in which the light valve consists of an array of tiny movable mirror-like pixels for deflecting a beam of light either to a display screen (ON) or away from the display optics (OFF). The pixels of the light valve device are also capable of being switched very rapidly. Thus, with the use of the light valve, the photolithography system of the present disclosure can implement changes in the mask pattern in a relatively quick manner. The light valve is used to modulate light in accordance with mask pattern information provided by the computer system 16. In addition, the DMD reflects light, thus no appreciable loss in intensity occurs when the patterned light is projected upon the desired subject during the lithographic mask exposure.

In an embodiment, the positioning of the mirrors in the micromirror array and the time duration of exposure can be modulated while positioned in a desired mask pattern. By dynamically changing the position of the mirrors while exposing a substrate and the time duration of exposure, the effects of pixelation on the exposed substrate and stiction of the mirrors can be reduced and/or gray scaled patterns can be produced, wherein the depth of photoreaction can be variably controlled to photoform layers of continuously variable thickness and/or composition. The duty cycle of the modulation command can be selectively modified to achieve an optimum ratio between on axis, direct exposure, and off axis, indirect exposure. The depth of photoactivation in the photo reactive material can be proportional to the time length and intensity of exposure. As a result, the micromirrors are constantly moving to prevent stiction, and further allow integration of interpixel exposure areas around directly radiated pixels to provide uniform coverage of the mask pattern to eliminate pixelation. In addition, pixelation can be reduced by defocusing the lens to "blend" adjacent pixels.

Typically, the micromirrors are quadrilateral in shape and mounted in an array such that they can be individually driven to deflect along a diagonal axis, for a maximum deflection of about 10 degrees away from normal in either direction along the diagonal axis. Light is typically reflected to a target by driving the mirror 10 degrees form normal in one direction to expose a target ("on"), and driven 10 degrees from normal in the opposite direction to reflect light away form the target ("off"). Variations in light intensity projected on a target can be accomplished by binary pulse width modulation of the driving signal. The length of duration at a particular on or off state is governed by the binary code representing various durations of time for light to be on or off.

Advantageously, the present system can allow an image to be shifted electronically to provide fine alignment of the pattern on substrate 20. The mask pattern is digitally shifted according to alignment information in one or more directions for achieving a desired mask alignment on substrate 20. Adjustments in alignment are carried out electronically in the mask bit pattern information provided to the light valve. As a result, fine adjustments in pattern alignment can thus be easily accomplished.

Movable alignment fixture 22, in conjunction with optical viewer 24, provides the capability to initially align substrate 20 under light beam 26 using mechanical alignment mechanisms (not shown) to align substrate 20 in three dimensions. Optical viewer 24 can incorporate, for example, cameras and/or other vision systems. The mechanical alignment system may include gears, pulleys, belts, chains, rods, screws, hydraulics, pneumatics, piezo motion or combinations thereof as known in the art to support and move an object in three dimensions. While performing alignment procedures, filter 11 is inserted in light beam 26 to filter out the wavelengths of light that react with the layer of photoreactive chemicals 21 on substrate 20. Optical viewer 24 can provide a means to monitor the positioning of substrate during manual alignment. While providing alignment in coplanar first and second dimensions, alignment fixture 22 advantageously provides alignment in a direction perpendicular to the coplanar first and second dimensions, allowing fabrication of three dimensional objects. For example, to gain more control over sidewall profiles or to produce complicated structures, multiple layers of substrate 20 can be sequentially exposed by aligning substrate 20 in the third dimension to create three-dimensional features. Coupled with computer controlled alignment of the desired pattern, the invention provides the capability to quickly manually align substrate 20 under light beam 26 and allows computer system 16 to automatically finely tune the alignment before exposing layer of photoreactive chemicals 21 on substrate 20. Moveable alignment fixture 22 can incorporate a means to allow rotation of the substrate in one, two, or three directions. In a specific embodiment, the alignment fixture can be interconnected with computer system 16 so as to allow computer system 16 to coordinate the control of the position of the micromirrors and the rotation of the substrate in one, two, or three directions and/or the movement of the substrate in one, two, or three dimensions, to accomplish the desired mask pattern.

Figure 1B:
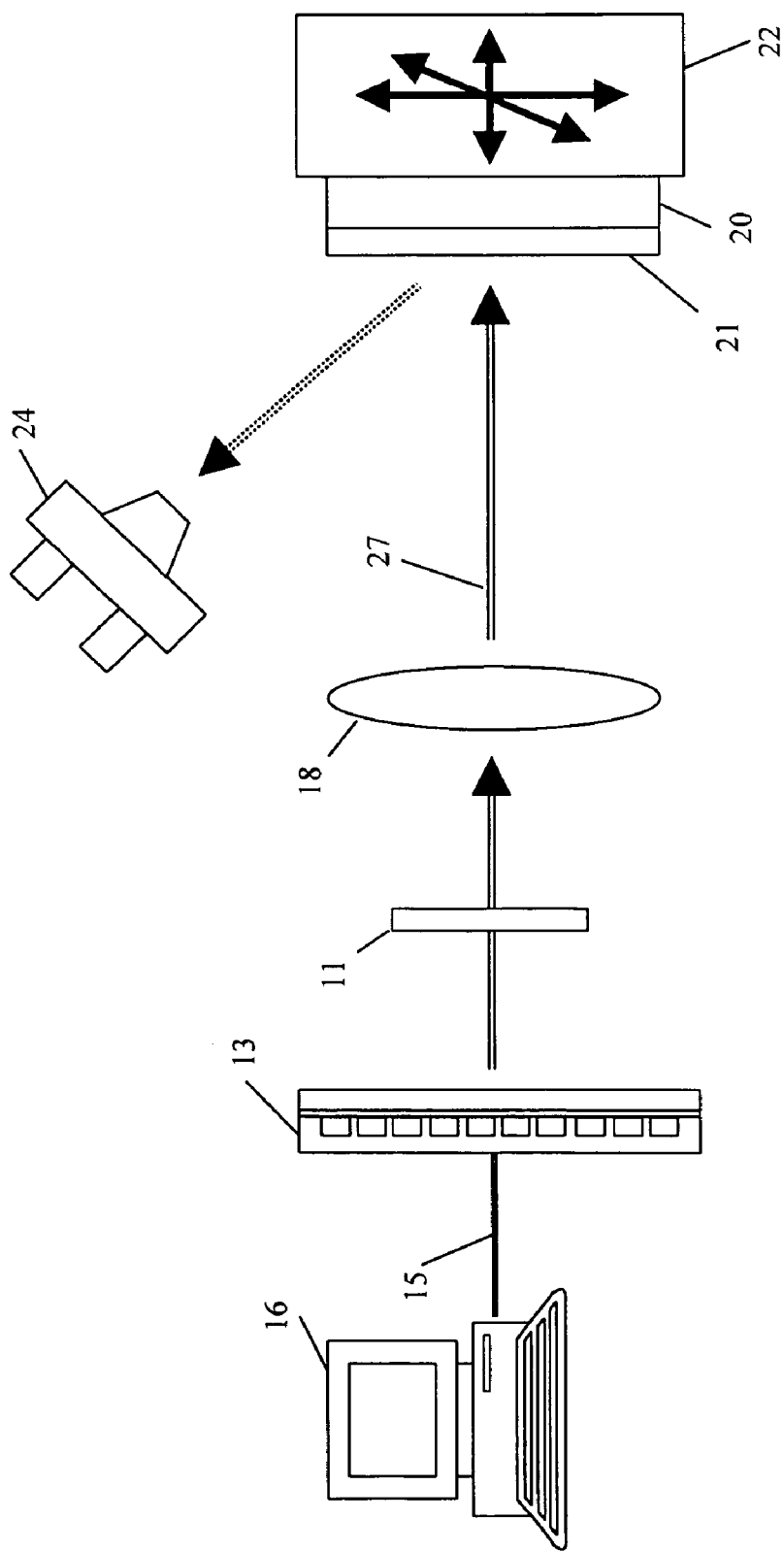
FIG. 1B illustrates a maskless photolithography system using a plasma display device according to an embodiment of the present invention.

In an alternative embodiment shown in FIG. 1B, a plasma display device 13 can be substituted for the micromirror array 14, light source 10 and associated optics of FIG. 1A. Referring now to FIG. 1B, an embodiment of the current invention includes a plasma display device 13, a computer system 12, a lens system 16, a substrate 20, mounted on a movable alignment fixture 22, and an optical viewer 24. A layer of photoreactive chemicals 21 is disposed on the substrate 20.

As shown, plasma display device 13 generates a beam of light, or patterned light beam 27, wherein each pixel of the plasma display 13 corresponds to a pixel of the mask pattern. Plasma display device 13 is controlled by computer system 16 over signal line(s) 14 to generate light according to a desired mask pattern stored in memory. In addition, computer system 12 can optionally shift the desired mask pattern in two dimensions to align the pattern with the substrate 20 mounted on movable alignment fixture 22. Precise pattern alignments are made electronically by shifting the mask pattern information provided to the plasma display device 13 such that the image directed to the substrate is translated to correct for misalignment. For example, if the mask pattern needs to be shifted to the right one pixel width to be properly aligned on the substrate, the computer compensates for the misalignment by shifting the mask pattern one pixel width to the right.

The patterned light beam radiated from plasma display device 13 can be selectively filtered by inserting or removing filter 18 from patterned light beam 27. Filtering can take place at any point along the light beam path to prevent exposure during alignment. A lens system 16 can collimate and condition the light beam as desired. After passing through lens system 16, patterned light beam 27 impinges on a layer of photoreactive chemicals 21 applied to substrate 20, thereby creating a pattern on substrate 20 by producing a photo-reaction in the layer of photoreactive chemicals 21 on the substrate 20. Alternatively, a photoresist chemical could be applied to substrate 20 to etch areas of substrate 20 not masked off by the mask pattern during an exposure. In a specific embodiment, the plasma cell can be variably excited to create variable luminosity.

The system provides optics, a light source, and integrated electronic components used to directly generate patterns for the exposure of photoresist and other photoimagable materials. A broad band spectrum, high intensity white light source provides the exposure energy for the process. This light is then filtered and optimized for the exposure process, using a variety of integrated optical components. A direct coupled optical delivery system ensures efficient transfer of the light energy. Using proven optical techniques, the projected image is free of distortion and uniform through out the exposure area. With the optimized optical stream, the image is imposed in the light path, providing the final exposure pattern. This pattern is then transferred to the substrate surface and used to expose the photo-sensitive material required in the user's fabrication process.

A personal computer operably connected to a micromirror array provides mask patterns. The mask patterns are generated in the computer and then transferred to the micromirror array to provide the optical pattern for exposure. The pattern is transferred to a substrate and is observed using an optical microscope. This microscope is needed for pattern alignment to the substrate. Alignment is controlled through the use of a course alignment stage provided by a mechanically movable substrate mounting alignment fixture, combined with a fine, electronic alignment stage. This fine alignment stage is computer controlled and aligns the mask pattern reflected from the micromirror instead of moving the alignment fixture, thereby offering exceptional accuracy and repeatability. Once alignment is complete, substrate exposure occurs. Through the use of a step and repeat method, the entire substrate surface can be exposed and multiple layers can be created using an alignment stage movable in a direction parallel to the light beam.

In addition, according the invention, three-dimensional patterns can be created using the three dimension alignment capabilities disclosed above. For example, patterning using thick photo resist or multilayer patterning of individual photoresist layers. These techniques can be used to provide either a photomask for subsequent etching of substrate materials or if the photopolymer is compatible with the chemistry used in the device, the fabricated features can be used as part of the device itself.

The system described above can be adapted for use in novel environments. Specifically, a system and method of maskless photolithography can be used to create 2-D and 3-D patterns of continuously variable thickness on objects using gray scale photolithography. In addition, the system can be used to provide rapid, large area patterning of photoreactive materials.

II. Gray Scale Maskless Photolithography

A. System for Gray Scale Maskless Photolithography

Figure 2A:
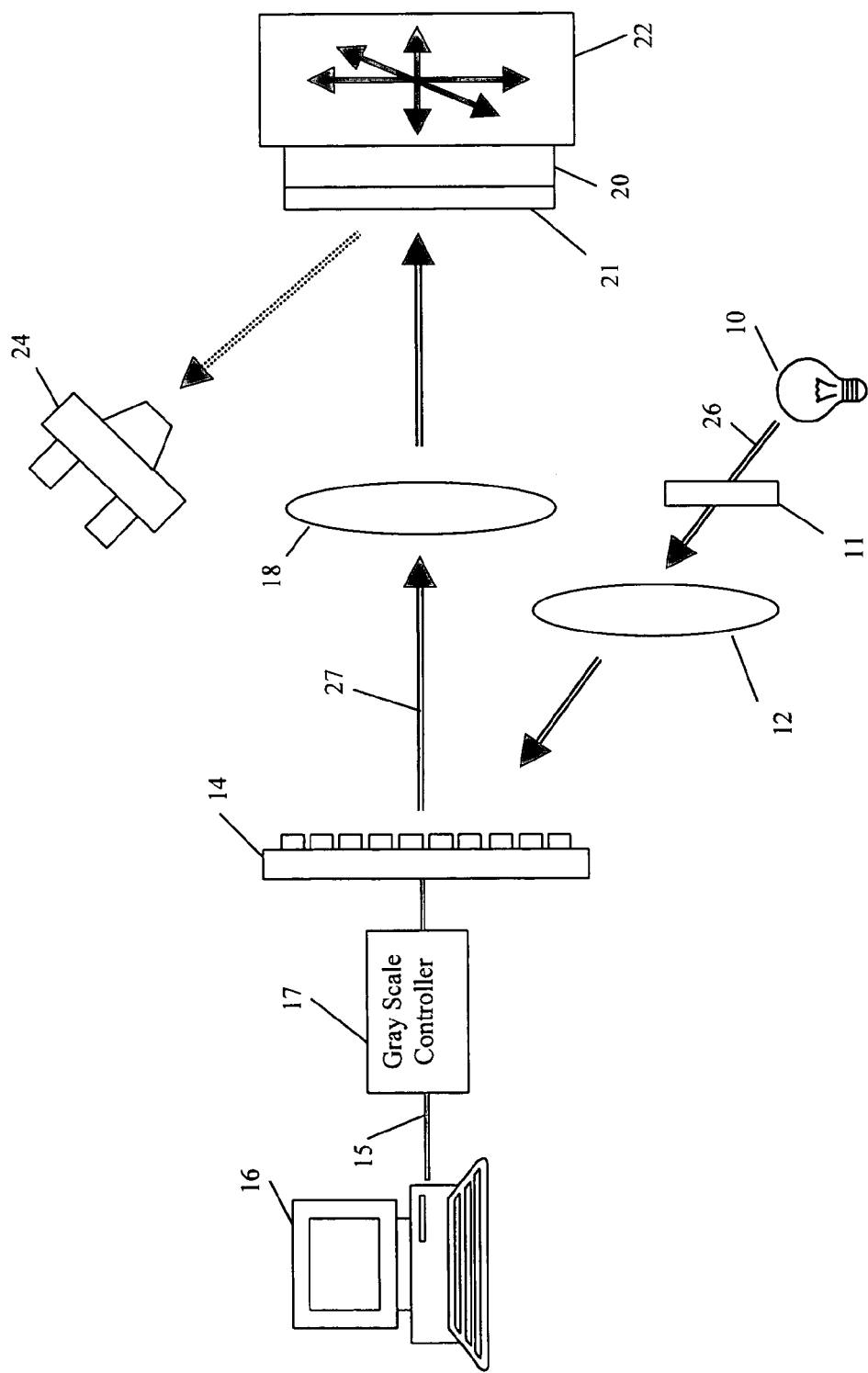
FIG. 2A illustrates a gray scale maskless photolithography system using a micromirror array according to an embodiment of the present invention.

Referring now to FIG. 2A, an embodiment of the current invention for gray scale photolithography will now be described. In the embodiment, a maskless photolithography system, as described above, is combined with gray scale controller to photoform continuously variable thickness in photoreactive materials. Patterns generated on the photoreactive material are defined by the patterned light radiated by the maskless photolithography system, where areas of continuously variable thickness and/or composition are created by varying the intensity or time duration of the patterned light exposure. By using photoreactive materials wherein the thickness of the final deposit and/or composition is a function of exposure time or intensity, a variety of 2D and 3D heterogenous microstructures and designs of multilayer, continuously varying thickness and/or composition can be created.

As shown in FIG. 2A, a maskless lithography system for gray scale patterning includes a light source 10, a removable filter 11, a first lens system 12, a micromirror array 14, a computer system 16, a gray scale controller 17, a second lens system 18, and a substrate 20, coated with a layer of photoreactive chemicals 21. In alternative embodiments, a movable alignment fixture 22 upon which the substrate 20 is mounted, and an optical viewer 24 are provided as depicted in FIG. 1A.

As depicted in FIG. 2A, light source 10 provides a beam of collimated light, or light beam 26, which can be selectively filtered by inserting or removing filter 11 from light beam 26. Light beam 26 is projected upon first lens system 12 and then onto micromirror array 14, wherein each mirror in the micromirror array corresponds to a pixel of the mask pattern. Computer system 20 provides, over signal line(s) 15, mask patterns to a gray scale controller 17, which modulates the received mask patterns to provide a gray scale mask pattern to the micromirror array 14. Micromirror then reflects light according to the gray scale mask pattern. In addition, computer system 16 can optionally shift the desired mask pattern in two dimensions to align the pattern with the substrate 20.

Figure 2B:
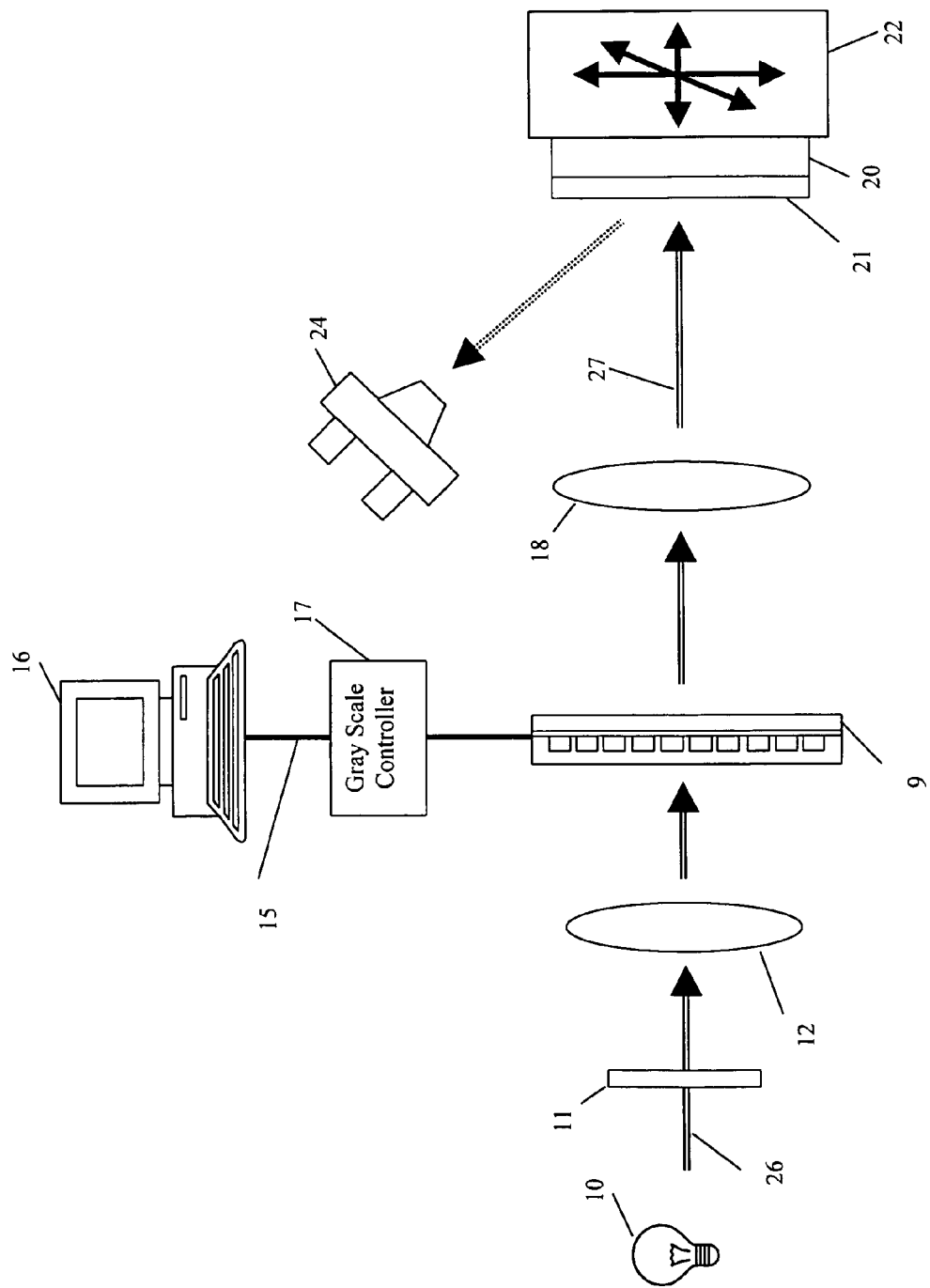
FIG. 2B illustrates a gray scale maskless photolithography system using a variably transmissive light filter device according to an embodiment of the present invention.

In another embodiment, as shown on FIG. 2B, a variably transmissive filter array device 9, such as a transmissive LCD display, is used to provide gray scaling. The variably transmissive filter array device 9 has individually addressable pixels, capable of being addressed to be opaque, to prevent light transmission, and capable of being addressed to be transparent, to allow light transmission.

As shown in FIG. 2B, the maskless lithography system for gray scale patterning includes a light source 10, a removable filter 11, a first lens system 12, a variably transmissive filter array device 9, a computer system 16, a gray scale controller 17, a second lens system 18, and a substrate 20, coated with a layer of photoreactive chemicals 21. In alternative embodiments, a movable alignment fixture 22 upon which the substrate 20 is mounted, and an optical viewer 24 are provided as depicted in FIG. 1A.

As depicted in FIG. 2B, light source 10 provides a beam of collimated light, or light beam 26, which can be selectively filtered by inserting or removing filter 11 from light beam 26. Light beam 26 is projected upon first lens system 12 and then onto the variably transmissive filter array device 9, wherein each individually addressable pixel of the variably transmissive filter array device 9 can be signaled to be opaque or transparent. Computer system 16 provides, over signal line(s) 15, mask patterns to a gray scale controller 17, which modulates the received mask patterns to provide a gray scale mask pattern to the variably transmissive filter array device 9. The variably transmissive filter array device 9 then transmits, by driving the addressed pixel to a transparent state, or blocks light, by driving the addressed to an opaque state, according to the gray scale mask pattern. In addition, computer system 16 can optionally shift the desired mask pattern in two dimensions to align the pattern with the substrate 20.

B. Method for Gray Scale Maskless Photolithography

Figure 3:
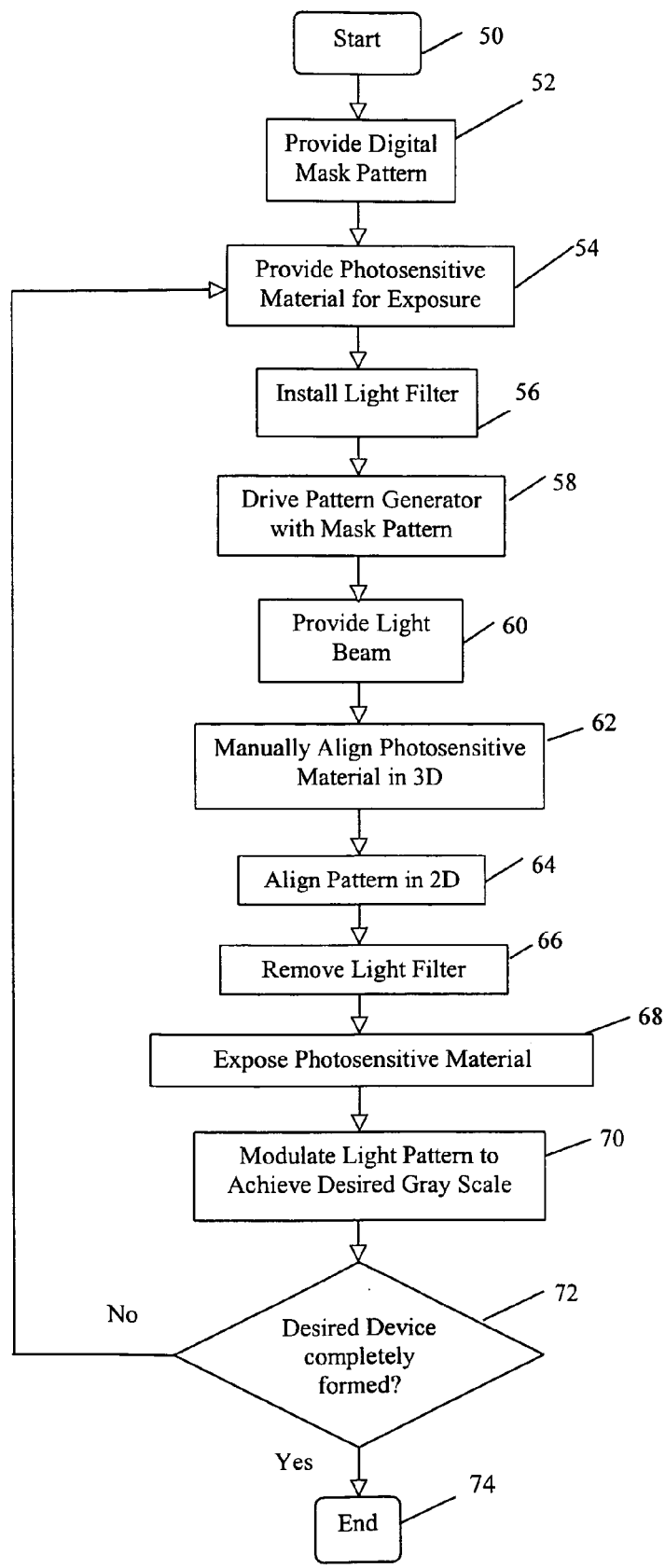
FIG. 3 is a flow chart illustrating a gray scale maskless photolithography method according to an embodiment of the present invention.

As depicted in FIG. 3 a method of using the current invention to photoform photosensitive materials using gray scale lithography will now be described. It should be understood that in certain situations for reasons of computational efficiency or ease of maintenance, the ordering and relationships of the blocks of the illustrated flow charts could be rearranged or re-associated by one skilled in the art. Starting from step 50, a desired mask pattern is designed and stored on computer system 16 in step 52. Alternatively, mask patterns can be designed on other computer systems and imported into computer system 16. Next, in step 54, a photosensitive material is provided for exposure to the patterned light beam 27. For example, the substrate 20 is affixed to alignment fixture 22 and coated with a layer of photoreactive chemicals 21 for exposure to the patterned light beam 27. After the photosensitive material is provided for exposure, the filter 11 is placed in the light beam 26 path according to step 56 to filter the light and prevent exposure of the photosensitive material until the system has been aligned.

Next, the computer system 16 is instructed to provide the resident mask pattern information to micromirror array 14 via the gray scale controller 17, as shown in step 58, and the micromirror array 14 responds by orienting each individual mirror to reflect or direct light beam 26 away from the photosensitive material according to the desired pattern. In an alternative embodiment, a variably transmissive filter array device 9 is used and the projected light beam 26 is directed through the variably transmissive filter array device 9 and towards the substrate 20. The variably transmissive filter array device 9 responds to the resident mask pattern information by preventing light transmission by causing the individual pixels of the variably transmissive filter array device 9 to be in an opaque state or a transparent state according to said gray scale mask patterns provided by said gray scale mask pattern controller 17. Consequently, the intensity of said gray scaled patterned light transmitted to the photosensitive material is varied by modulating the transmissive properties of said variably transmissive filter array device to achieve gray scale photosculpting and/or photo transforming of the photosensitive material.

Next, alignment of the photosensitive material is enabled by exciting the light source 10 to provide a light beam in step 60, projecting light beam 26 through first lens system 12, and then onto micromirror array 14. In turn, micromirror array 14 reflects light beam 26 through second lens system 18 and the photosensitive material.

With the desired pattern projected on the photosensitive material, the material can be manually and/or automatically aligned in three dimensions according to step 62, for example, by moving alignment fixture 22 to ensure that the photosensitive material is properly located in light beam 26. Proper alignment can be verified by viewing the projected pattern on the photosensitive material through optical viewer 24. In an optional embodiment, once the photosensitive material is manually and/or automatically aligned, alignment information can be provided to computer system 16 and computer system 16 automatically adjusts the micromirror 14 by shifting the pattern in two dimensions to attain proper alignment in step 64. Having aligned the photosensitive material, the material is exposed in step 68 by removing filter 11 from light beam 26 in step 68 and allowing the light to cause a photoreaction in the photosensitive material for a required reaction time depending on the photoreactive chemicals used. For example, using standard Novolac™ positive photoresist an exposure time of 60 seconds is used.

To accomplish gray scale patterning, the gray scale controller 17 modulates the mask pattern information in step 70 provided to the micromirror 14 to achieve a desired gray scale pattern 70. In an embodiment, the angular position and time duration of the angular positioning of the mirrors in micromirror array 14 is varied according to commands from gray scale controller 17 to create areas of varying thickness in the photosensitive material, and/or composition, according to the time duration and intensity of direct exposure. For example, when masking a 25 micron square feature on a photoresist coated substrate, angular position and time duration of the angular positioning of the mirrors in micromirror array 14 might be varied by the gray scale controller 17 so that the mask effectively covers an area of 36 microns square, centered on the desired 25 micron square feature. By varying the time of exposure around the perimeter of the 25 micron square feature, the resulting feature has sides that gradually slope away from the directly exposed 25 micron square down to the substrate wherein the thickness of the photoresist after development depends on the local dose of UV irradiation. The exposure time or intensity is adjusted to take into account the non-linear photo-response of the particular photo resist and proximity effects. Similar modulation of the mask pattern can be utilized to create varying compositional changes with respect to compositional change materials. In a specific embodiment, exposure time and/or light intensity can be varied as a function of position on the substrate to effect compositional changes with respect to compositional change materials of the substrate.

In an embodiment, the gray scale controller can use a pulse width modulation scheme to modulate the mask pattern provided to the micromirror array 14. By applying pulse width modulation to the control mask pattern information, the micromirrors of the array 14, driven reflect light to the photosensitive material according to the mask pattern, are further directed to occasionally reflect light away according to the duty cycle of the pulse code modulation. For example, in a pulse code modulation scheme, the duty cycle for the angular deflection could be adjusted so that a desired feature is exposed (by directing the mirrors to reflect light to the feature on the photosensitive material) for 90% of the total exposure time and masked (by directing the mirrors to reflect light away from the feature on the photosensitive material) the remaining 10% of the total exposure time. With respect to a feature exposed for 100% of the exposure time, the feature exposed for only 90% of the entire exposure time will be proportionately smaller because of the decreased exposure time and the resulting curing response of the photoreactive material.

In addition to time modulation of the mask pattern, the pattern can also be spatially modulated to provide continuously variable pattern exposure. In spatial modulation, the varying thicknesses and/or composition of photoreactive material can be sculpted by modulating the positioning of the mirrors in the micromirror array that are already positioned to form a mask pattern. In this embodiment, the mirrors are directed to different areas of the substrate, and the desired area exposed sequentially in a series of directly radiating exposures. Consequently, gray scaling is accomplished by applying fewer sequential exposure steps to the desired area to create thinner thickness of photoreactive material, and applying a greater number of sequential exposure steps to the desired area to create thicker thickness and/or compositional changes of photoreactive material. As a result continuously variable thicknesses can be created by selectively controlling the number of sequential exposure steps.

In yet another embodiment, spatial modulation can be combined with time modulation to create continuously variable thickness and/or composition. Both the number of sequential exposure steps and the modulation of the mirror positioning during each exposure step provides further control over the gray scaling process.

In still another embodiment, a plasma display device 13 is used as both a light source and pattern generator. In this embodiment the intensity of each pixel of light is variably excited and/or modulated to create gray scaled patterns. In addition, spatial modulation can be employed as described above, and both intensity modulation and spatial modulation can be combined to create gray scale patterns on substrates.

In addition to providing gray scale patterns, by dynamically modulating the mirrors as described, the mirrors can be dynamically positioned so as to reduce stiction of the mirrors. Further, pixelation effects on the substrate are reduced by providing mask pattern coverage of the inter-pixel areas not exposed to direct, on axis illumination.

If further exposures are desired in step 72, such as required when creating three-dimensional objects, the above method is repeated by returning to step 52 until the desired object is fabricated. A new digital mask pattern is provided, another photoreactive coat is applied, and the substrate is realigned and re-exposed. Once the desired object has been created, the process ends in step 74.

III. Large Area Patterning Maskless Photolithography

Referring now to FIGS. 1A and 1B, embodiments of the current invention for creating large area patterns on substrates will be described. In the large area patterning embodiments, a maskless photolithography system is provided that enables efficient writing of patterns to large areas in order to permit maximal image resolution for a maximal field size. A patterned light generator projects images onto photo reactive compounds mounted on a movable alignment fixture 22. In a specific embodiment, the system uses a micromirror array device as described previously and shown in FIG. 1A, to direct patterned light to a substrate 20. In an alternate embodiment, the system uses a plasma display device as described previously and shown in FIG. 1B, to generate and direct patterned light to a substrate 20. During exposure, the patterned light generator moves across a large substrate 20, while at the same time successively changing the projected pattern to a large image exposure area. Alternatively, the substrate 20 is moved under the patterned light beam 27 while at the same time the projected pattern is successively changed to expose a large area. In yet another embodiment, the computer system 16 can control the movement of the substrate under the patterned light beam 27 to synchronize the patterned light projected on the substrate with the desired substrate area of projection.

Figure 4:
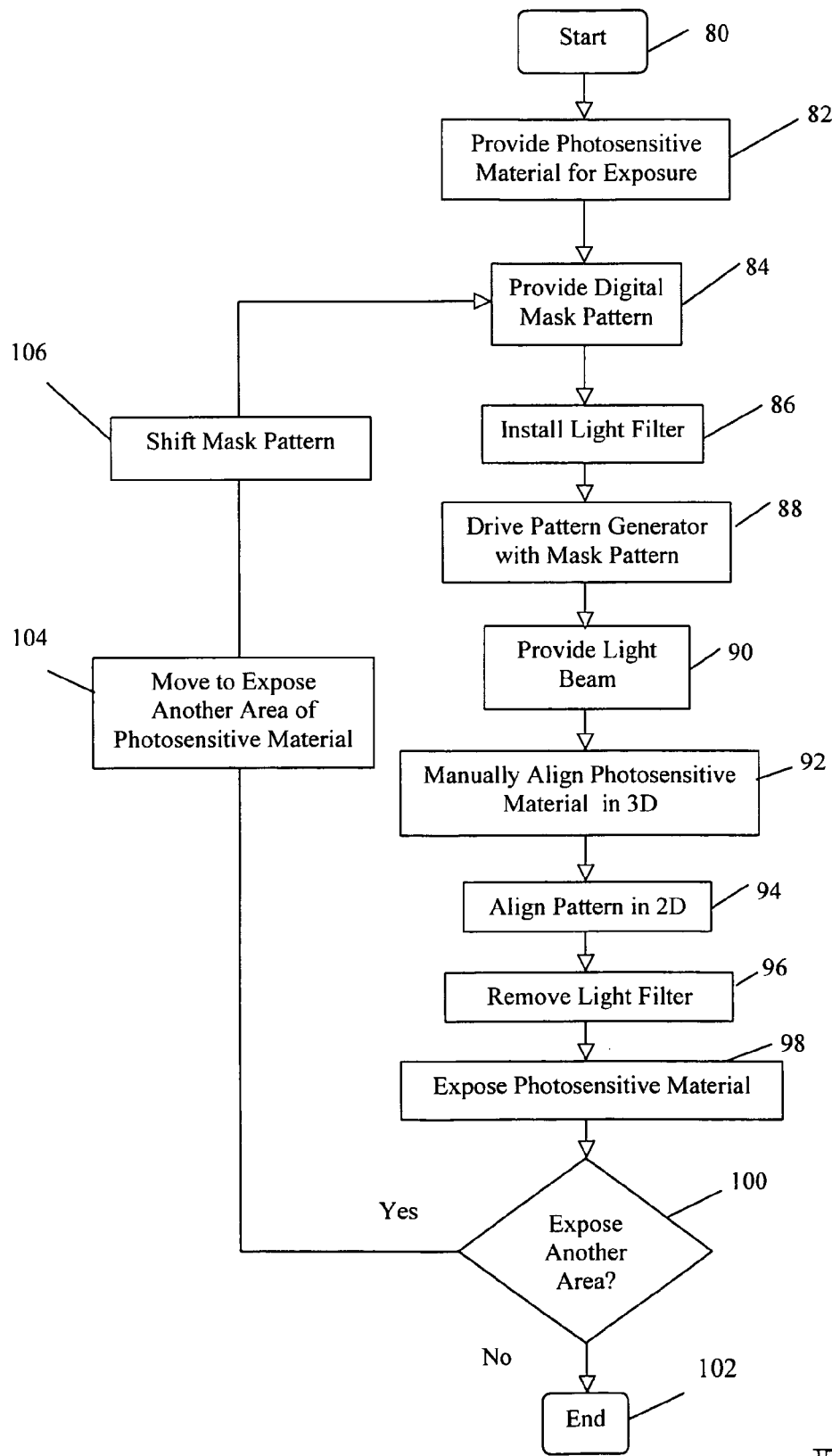
FIG. 4 is a flow chart illustrating a large area patterning maskless photolithography method according to an embodiment of the present invention.

Turning now to FIG. 4, a method of using the current invention to photoform large area photosensitive materials using maskless photolithography will now be described. It should be understood that in certain situations for reasons of computational efficiency or ease of maintenance, the ordering and relationships of the blocks of the illustrated flow charts could be rearranged or re-associated by one skilled in the art. Starting from step 80, a photosensitive material is provided for exposure to the patterned light beam 27 in step 82. For example, the substrate 20 is affixed to alignment fixture 22 and coated with a layer of photoreactive chemicals 21 for exposure to the patterned light beam 27. Next, a desired mask pattern is designed and stored on computer system 16 in step 84. Alternatively, mask patterns can be designed on other computer systems and imported into computer system 16. After the mask pattern is provided for exposure, the filter 11 is placed in the light beam 26 path according to step 86 to filter the light and prevent exposure of the photosensitive material until the system has been aligned.

Next, the computer system 16 is instructed to provide the resident mask pattern information to the pattern generator in step 88, and the pattern generator responds by providing a patterned light beam 27 to the photosensitive material according to the desired pattern in step 90. With the desired pattern projected on the photosensitive material, the material can be manually aligned in three dimensions according to step 92, for example, by moving alignment fixture 22 to ensure that the photosensitive material is properly located in light beam 26. Proper alignment is verified by viewing the projected pattern on the photosensitive material through optical viewer 24. In an optional embodiment, once the photosensitive material is manually aligned, alignment information can be provided to computer system 16 and computer system 16 automatically adjusts the pattern generator by shifting the pattern in two dimensions to attain proper alignment in step 94. Having aligned the photosensitive material, the filter is removed from light beam 26 in step 96 and the photosensitive material is exposed in step 98, allowing the light to cause a photoreaction in the photosensitive material for a required reaction time depending on the photoreactive chemicals used.

For large area patterning, steps 84 through 98 are repeated until the desired large area has been exposed. Specifically, if another area of the photosensitive material needs to be exposed in step 100, the system can be realigned to expose that area 104. Such realignment can be performed manually and/or automatically. For example, the pattern generator is moved to illuminate a new area on the photosensitive material or the photosensitive material is moved under the light beam to expose a new area. In an embodiment, the relative movement of the pattern generator and the photosensitive material is synchronized to mutually align the pattern generator and the photosensitive material with respect to each other to expose new areas. Movement is provided in two coplanar dimensions perpendicular to the incident patterned light beam 27. Alternatively, movement is provided in a linear one-dimensional direction, such as in a conveyor belt fashion.

After the alignment to expose a new area of the photosensitive material 104, the mask pattern is shifted 106 to provide the appropriate pattern for the new area to be exposed and the process returns to step 84. The process described in steps 84 through 98 is then repeated. If no other areas need to be exposed, the process ends on step 102. Following the described procedure, large area patterns can be created, including generation of large 3 dimensional patterns by sequentially exposing layers on top of previously created layers.

The system and method can be used to produce large area microelectronics, large area micro-electromechanical systems, large area printed materials, large area sensors, whole wafer patterning, mixed scale electronics (printed wiring boards and micro-electromechanical systems), mixed signal electronic patterning (digital circuitry and analog circuitry, large area printed inks (graphic and electronic) and systems on a wafer. The subject invention can also be used to produce large area variable 2D and 3D materials of any composition that may be photo imageable, or may be non-photo imageable materials defined by photo imageable material/features.

IV. Method for Maskless Photolithography

Figure 5:
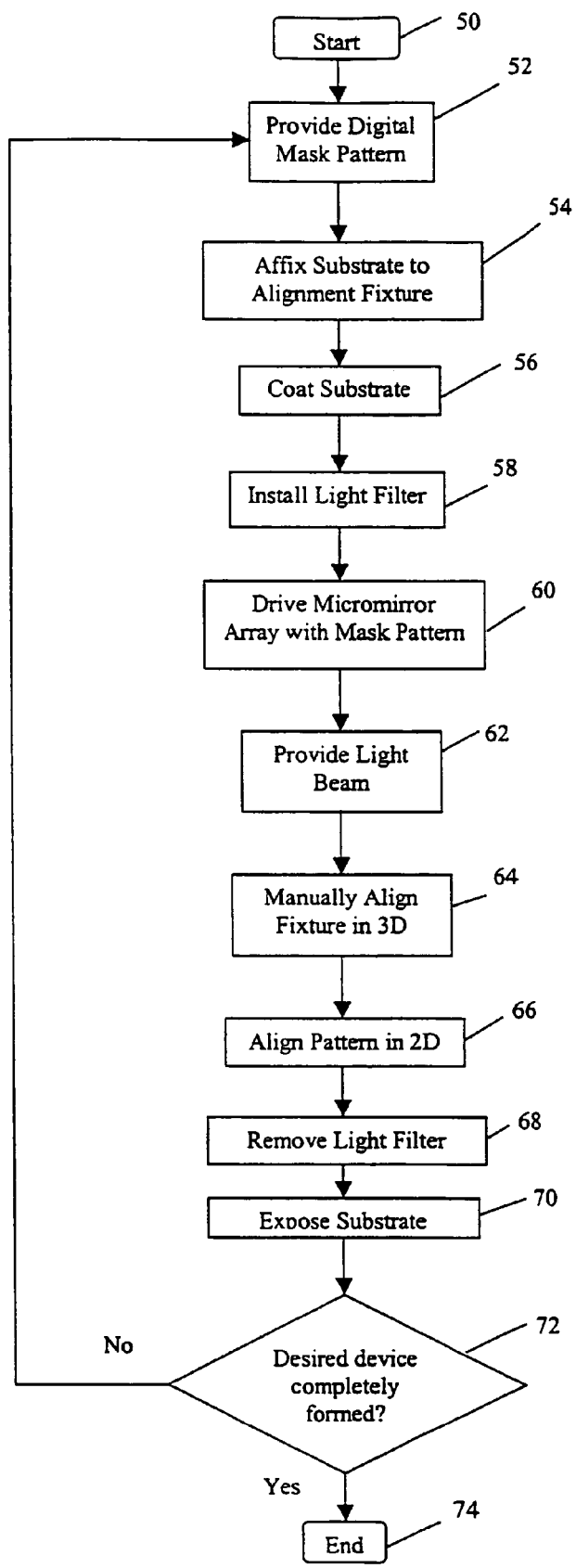
FIG. 5 is a flow chart illustrating a maskless photolithography method according to an embodiment of the present invention.

A method of using the current invention to fabricate designs will now be described. It should be understood that in certain situations for reasons of computational efficiency or ease of maintenance, the ordering and relationships of the blocks of the illustrated flow charts could be rearranged or re-associated by one skilled in the art. Referring to FIG. 5, starting from step 50, a desired mask pattern is designed and stored on computer system 16 in step 52. Alternatively, mask pattern designs can be designed on other computer systems and imported into computer system 16. Next, in step 54, a substrate 20 is placed on alignment fixture 22 and coated with a layer of photoreactive chemicals 21 in step 56. Once the substrate is mounted in alignment fixture 22, the filter 11 is placed in the light beam 26 path according to step 58 to filter the light and prevent exposure of the substrate. Next, the computer system 16 can then be instructed to provide the resident mask pattern information to micromirror array 14 as shown in step 60, and the micromirror array 14 responds by orienting each individual mirror to reflect or direct light beam 26 away from substrate 20 according to the desired pattern. Next, alignment of the substrate is enabled by exciting the light source 10 to provide a light beam in step 62, projecting light beam 26 through first lens system 12, and then onto micromirror array 14. In turn, micromirror array 14 reflects light beam 26 through second lens system 18 and onto layer of photoreactive chemicals 21 and substrate 20.

With the desired pattern projected on substrate 20, alignment fixture 22 can be manually aligned in three dimensions according to step 64 by moving alignment fixture 22 to ensure that substrate 20 is properly located in light beam 26. Proper alignment can be verified by viewing the projected pattern on substrate 20 through optical viewer 24. Once substrate 20 is manually aligned, alignment information can optionally be provided to computer system 16 and computer system 16 automatically adjusts the micromirror 14 by shifting the pattern in two dimensions to attain proper alignment in optional step 66. Having aligned substrate 20, the layer of photoreactive chemicals 21 on substrate 20 is exposed in step 70 by removing filter 11 from light beam 26 in step 68 and allowing the light to cause a reaction between layer of photoreactive chemicals 21 and substrate 20 for a required reaction time depending on the photoreactive chemicals used. For example, using standard Novolac™ positive photoresist, an exposure time of 60 seconds is used. In an embodiment, during exposure step 70, the angular position and time duration of the angular positioning of the mirrors in micromirror array 14 is varied according to commands from computer system 16. For example, when masking a 25 micron square feature, angular position and time duration of the angular positioning of the mirrors in micromirror array 14 might be varied so that the mask effectively covers an area of 36 microns square, centered on the desired 25 micron square feature. As a further example, the duty cycle for the angular deflection could be adjusted so that the 25 micron square feature is masked 90% of the total exposure time and the remaining 11 square micron area is covered 10% of the total exposure time. By dynamically modulating the mirrors as described, stiction of the mirrors is reduced. Further, pixelation effects on the substrate are reduced by providing mask pattern coverage of the inter-pixel areas not exposed to direct, on axis illumination.

In an embodiment in which alignment 22 is interconnected with computer system 16, the movement and/or rotation of the substrate can be effected via instructions sent to the alignment fixture 22 from computer system 16 in accordance with the desired mask pattern. Accordingly, multiple exposures of the substrate can be accomplished for each coating of the substrate, for example with the substrate in different positions and/or rotations, so as to accomplish the desired mask pattern.

If further exposures are desired in step 72, such as required when creating three-dimensional objects, the above method is repeated by returning to step 52 until the desired object is fabricated. A new digital mask pattern is provided, another photoreactive coat is applied, and the substrate is realigned and re-exposed. Once the desired object has been created, the process ends in step 74.

V. Exemplary Embodiment

An example of the current invention using the system and method described above will now be presented. In an embodiment, the current invention is designed to be an integrated, reconfigurable, rapid prototyping maskless photography system. The system provides optics, a light source, and integrated electronic components used to directly generate patterns for the exposure of photoresist and other photoimagable materials. A broad band spectrum, high intensity white light source provides the exposure energy for the process. This light is then filtered and optimized for the exposure process, using a variety of integrated optical components. A direct coupled optical delivery system ensures efficient transfer of the light energy. Using proven optical techniques, the projected image is free of distortion and uniform through out the exposure area. With the optimized optical stream, the image is imposed in the light path, providing the final exposure pattern. This pattern is then transferred to the substrate surface and used to expose the photosensitive material required in the user's fabrication process.

A personal computer operably connected to a micromirror array to provide mask patterns. The mask patterns are generated in the computer and then transferred to the micromirror array to provide the optical pattern for exposure. The pattern is transferred to a substrate and is observed using an optical microscope. This microscope is needed for pattern alignment to the substrate. Alignment is controlled through the use of a course alignment stage provided by a mechanically movable substrate mounting alignment fixture, combined with a fine, electronic alignment stage. This fine alignment stage is computer controlled and aligns the mask pattern reflected from the micromirror instead of moving the alignment fixture, thereby offering exceptional accuracy and repeatability. Once alignment is complete, substrate exposure occurs. Through the use of a step and repeat method, the entire substrate surface can be exposed and multiple layers can be created using an alignment stage movable in a direction parallel to the light beam.

Figure 6:
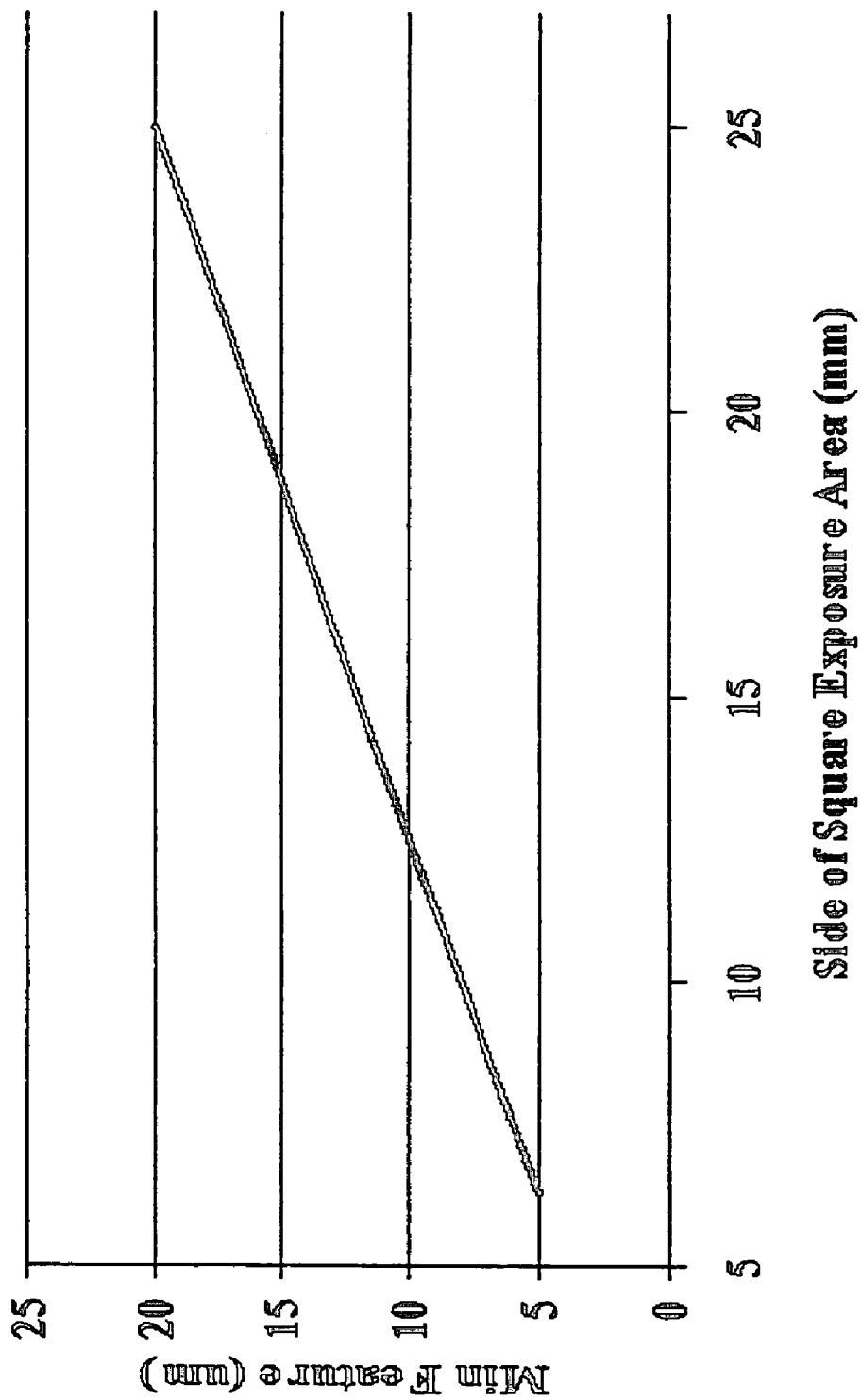
FIG. 6 is a graph showing the relation between exposure area and minimum feature size according to the current invention.

In the exemplary embodiment, the light source exhibits a spectral peak at 436 nm as shown in FIG. 6. As a result the invention produces light compatible with g-line photoresist material and other photopolymers that activate in this spectral region. In addition, typical exposure energy density for a 2.5 cm by 2.5 cm exposure area is 225 mJ/cm$^2$. However, the energy density can be adjusted as required. By using DMDs designed to withstand higher levels and different wavelengths of UV light, different frequencies can be used, such as UV light having a spectral peak at 365 nm.

Figure 7:
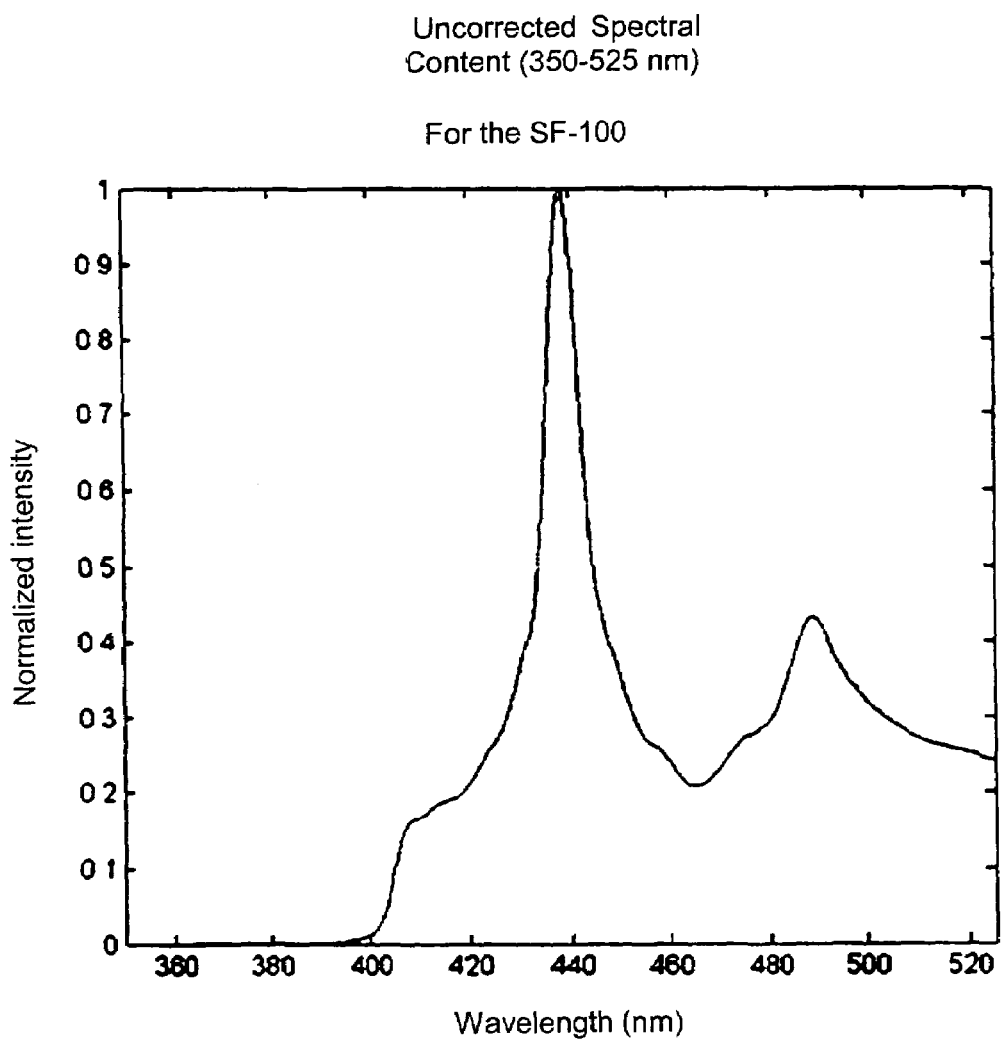
FIG. 7 is a graph showing an exemplary spectral output of the current invention.

FIG. 7 shows how the minimum feature size varies depending on the desired exposure area. The invention is capable of creating features as small as 5 micrometers (μm) for an exposure area of 6.25 millimeters (mm) by 6.25 mm. As shown on the graph, as the desired minimum feature size increases, the exposure feature size increases linearly. For example, for a minimum feature size of 20 μm, the exposure field is increased to 25 mm by 25 mm.

In addition, according the invention, three-dimensional patterns can be created using the three dimension alignment capabilities disclosed above. For example, patterning using thick photo resist or multiplayer patterning of individual photoresist layers. These techniques can be use to provide either a photomask for subsequent etching of substrate materials or if the photopolymer is compatible with the chemistry used in the device, the fabricated features can be used as part of the device itself.

Based on the foregoing specification, the computer system of the disclosed invention may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the invention. The computer readable media may be, for instance, a fixed (hard) drive, diskette, optical disk, magnetic tape, semiconductor memory such as read-only memory (ROM), etc., or any transmitting/receiving medium such as the Internet or other communication network or link. The article of manufacture containing the computer code may be made and/or used by executing the code directly from one medium, by copying the code from one medium to another medium, or by transmitting the code over a network.

One skilled in the art of computer science will easily be able to combine the software created as described with appropriate general purpose or special purpose computer hardware to create a computer system or computer subsystem embodying the method of the invention. An apparatus for making, using or selling the invention may be one or more processing systems including, but not limited to, a central processing unit (CPU), memory, storage devices, communication links and devices, servers, I/O devices, or any sub-components of one or more processing systems, including software, firmware, hardware or any combination or subset thereof, which embody the invention. User input may be received from the keyboard, mouse, pen, voice, touch screen, or any other means by which a human can input data into a computer, including through other programs such as application programs.

It should be understood that the example and embodiments described herein are for illustrative purposes only and that various modifications or changes in light thereof will be suggested to persons skilled in the art and are to be included within the spirit and purview of this application.

What is claimed is:

1. A system for maskless photolithography, comprising:
   a. a computer system for generating mask patterns and alignment instructions;
   b. an array of positionable micromirrors, operably connected to and controllable by said computer system, wherein said micromirrors reflect light according to said mask patterns provided by said computer system;
   c. an optical system for generating, collimating, and directing a light beam to said micromirror array;
   d. an optical system for further collimating the light beam reflected from said mirrors and directing the light beam onto a substrate;
   e. an alignment fixture for mounting the substrate, wherein said alignment fixture is movable in coplanar first and second dimensions, and in a third dimension direction substantially perpendicular to said first and second coplanar dimensions and substantially parallel to the light beam reflected from said micromirrors; said fixture providing three dimensional alignment of a substrate beneath the light beam, wherein said alignment fixture is moved in three dimensions in response to mechanical alignments directly provided by a user;
   f. a means for controlling the position of the alignment fixture in the first, second, and third dimensions, such that controlling the position of the alignment fixture in the first, second, and third dimensions controls the position of the substrate in the first, second, and third dimensions;
   g. a computer controlled pattern alignment system, for providing electrical alignment of said patterns in coplanar first and second dimensions, wherein said pattern alignment system adjusts the alignment of said mask patterns in coplanar first and second dimensions by altering the positioning of said micromirrors in response to instructions provided by said computer according to said alignment information, so that said pattern is shifted in at least one coplanar direction;
   h. an optical viewer to allow optical monitoring of positioning of the substrate mounted in said alignment fixture by visually verifying that an image projected on the substrate is properly aligned; and
   i. an optical filter, removably mounted in the light beam to selectively filter light impinging on the substrate to prevent exposure of the substrate during an alignment procedure.

2. The system according to claim 1, wherein the means for controlling the position of the alignment fixture is interconnected with the computer system such that control of the position of the alignment fixture is coordinated with control of the position of each micromirror of said array of micromirrors by the computer system.

3. The system according to claim 1, further comprising:
   a means for controlling the rotation of the alignment fixture in at least a first direction such that controlling the rotation of the alignment fixture in the at least first direction controls the rotation of the substrate in the at least first direction.

4. The system according to claim 3,
   wherein the means for controlling the rotation of the alignment fixture in at least a first direction is interconnected with the computer system such that control of the rotation of the alignment fixture is coordinated with control of the position of each micromirror of said array of micromirrors by the computer system.

5. The system of claim 1, further comprising a computer controlled pattern modulation system, for varying the angular position and time duration of angular positioning of said micromirrors when exposing a substrate, said modulation system altering the positioning and time duration of angular positioning of said micromirrors in response to instructions provided by said computer, whereby pixelation and stiction are reduced.

6. The system of claim 1, wherein said optical filter is an ultraviolet (UV) filter.

7. The system of claim 1, wherein the substrate is a photoresist coated substrate.

8. The system of claim 1, wherein the substrate is a photoreactive coated substrate.

9. A method for maskless photolithography, comprising:
   a. receiving mask pattern information corresponding to a desired pattern to be created on a substrate;
   b. generating mask patterns based on received mask pattern information;
   c. providing said mask patterns to an array of positionable micromirrors, operably connected to and controllable by a computer system;

d. generating, collimating, and directing a light beam to said micromirror array;

e. providing selective filtering of the light beam impinging on the substrate to prevent exposure of the substrate during an alignment procedure;

f. positioning said micromirrors to reflect the light beam from said micromirror array according to said mask patterns provided by said computer system;

g. collimating the light beam reflected from said micromirror array and directing the light beam onto a substrate;

h. aligning the substrate under the light beam by moving the substrate in three dimensions, wherein the substrate is moved in coplanar first and second dimensions, and moved in a third dimension direction substantially perpendicular to said first and second coplanar dimensions, and substantially parallel to the light beam reflected from said micromirror array, wherein aligning the substrate comprises aligning the substrate via a means for controlling the position of an alignment fixture in which the substrate is mounted, i. allowing optical monitoring of positioning of the substrate under the light beam to visually verify that an image projected on the substrate is properly aligned;

j. receiving alignment information corresponding to alignment of a desired mask pattern projected onto a substrate;

k. generating alignment instructions based on received alignment information;

l. providing alignment instructions, based on said alignment information, to said micromirror array to further align said mask patterns in the coplanar first and second dimensions;

m. adjusting said micromirror array according to said alignment instructions by shifting the mask pattern in at least one of the coplanar first and second dimensions;

n. disabling filtering of the light beam;

o. exposing the substrate; and p. repeating steps (a-o) to create a desired pattern on the substrate.

10. The method according to claim 9, wherein the means for controlling the position of the alignment fixture is interconnected with the computer system such that control of the position of the alignment fixture is coordinated with control of the position of each micromirror of said array of micromirrors by the computer system.

11. The method according to claim 9, wherein aligning the substrate comprises aligning the substrate via a means for controlling the rotation of the alignment fixture in which the substrate is mounted in at least a first direction.

12. The method according to claim 11, wherein aligning the substrate comprises aligning the substrate via a means for controlling the rotation of the alignment fixture in which the substrate is mounted in the first direction, controlling the rotation of the alignment fixture in a second direction perpendicular to the first direction, and controlling the rotation of the alignment fixture in a third direction perpendicular to the first direction and perpendicular to the second direction.

13. The method according to claim 11, wherein the means for controlling the rotation of the alignment fixture in at least a first direction is interconnected with the computer system such that control of the rotation of the alignment fixture is coordinated with control of the position of each micromirror of said array of micromirrors by the computer system.

14. The method of claim 9, further comprising varying the angular position and time duration of angular positioning of said micromirrors when exposing a substrate, whereby pixelation and stiction are reduced.

15. The method of claim 9, wherein said receiving mask pattern information further comprises providing mask pattern information corresponding to a desired pattern to be created on a substrate.

16. The method of claim 9, wherein said providing selective filtering of the light beam further comprises placing an optical filter in the light beam path.

17. The method of claim 9, wherein aligning the substrate further comprises manually aligning a substrate under the light beam by moving the substrate in three dimensions in response to mechanical alignments provided by a user.

18. The method of claim 9, wherein said allowing optical monitoring further comprises optically monitoring positioning of the substrate under the light beam to visually verify that an image projected on the substrate is properly aligned.

19. The method of claim 9, wherein said disabling filtering further comprises removing said optical filter from the light beam path.

20. The method of claim 19, wherein said optical filter is an ultraviolet (UV) filter.

21. The method of claim 9, wherein the substrate is a photoresist coated substrate and successive layers are etched away from the substrate according to the projected mask pattern.

22. The method of claim 9, wherein the substrate is a photoreactive coated substrate and successive layers are added to the substrate according to the projected mask pattern.

23. A method for maskless photolithography, comprising:

a. providing a computer system for generating mask patterns and alignment instructions, wherein said system provides mask patterns to a micromirror array and provides instructions to align patterns in coplanar first and second dimensions, by altering the position of said micromirrors in response to instructions provided by said computer according to alignment information so that the pattern is translated in at least one coplanar direction;

b. providing an array of positionable micromirrors, operably connected to and controllable by said computer system; wherein said micromirrors reflect light according to said mask patterns provided by said computer system;

c. providing an optical system for generating, collimating, and directing a light beam to said array of micromirrors;

d. providing an optical system for further collimating the light beam reflected from said mirrors and directing the light beam onto a substrate;

e. providing an alignment fixture for mounting the substrate, wherein said alignment fixture is movable in coplanar first and second dimensions, and in a third dimension direction substantially perpendicular to said first and second coplanar dimensions and substantially parallel to the light beam reflected from said micromirrors; said fixture providing three dimensional alignment of the substrate beneath the light beam, wherein the alignment fixture comprises a means for controlling the position of the alignment fixture in the first, second, and third dimensions; and f. providing an optical viewer to allow optical monitoring of positioning of a substrate mounted in said alignment fixture by visually verifying that an image projected on the substrate is properly aligned.

24. The method according to claim 23, wherein the means for controlling the position of the alignment fixture is interconnected with the computer system such that control of the position of the alignment fixture is coordinated with control of the position of each micromirror of said array of micromirrors by the computer system.

25. The method according to claim 23, wherein the alignment fixture comprises a means for controlling the rotation of the alignment fixture in at least a first direction.

26. The method according to claim 25, wherein the means for controlling the rotation of the alignment fixture in at least a first direction controls the rotation of the alignment fixture in the first direction, controls the rotation of the alignment fixture in a second direction perpendicular to the first direction, and controls the rotation of the alignment fixture in a third direction perpendicular to the first direction and perpendicular to the second direction.

27. The method according to claim 25, wherein the means for controlling the rotation of the alignment fixture in at least a first direction is interconnected with the computer system such that control of the rotation of the alignment fixture is coordinated with control of the position of each micromirror of said array of micromirrors by the computer system.

28. The method of claim 23, further comprising providing a computer controlled pattern modulation system, for varying the angular position of said micromirrors when exposing a substrate, said modulation system altering the positioning and time duration of angular positioning of said micromirrors in response to instructions provided by said computer, whereby pixelation and stiction are reduced.

29. A computer system for maskless photolithography, comprising:
  a. a computing device comprising a display, a central processing unit (CPU), operating system software, memory for storing data, a user interface, and input/output capability for reading and writing data; said computing device operably connected to and operating in conjunction with a maskless photolithography system;
  b. computer program code for:
  1) receiving mask pattern information corresponding to a desired pattern to be created on a substrate;
  2) generating mask patterns based on received mask pattern information;
  3) providing said mask patterns to an array of positionable micromirrors, operably connected to and controllable by said computer system;
  4) receiving alignment information corresponding to alignment of a desired mask pattern projected onto a substrate;
  5) generating alignment instructions based on received alignment information;
  6) providing alignment instructions to a means for positioning an alignment fixture in which the substrate is mounted;
  7) providing alignment instructions, based on said alignment information, to said micromirror array to further align said mask patterns in the coplanar first and second dimensions:
  8) adjusting the micromirror array according to said alignment instructions by shifting the mask pattern in at least one of the coplanar first and second dimensions; and
  9) repeating steps (1-8) to create a desired pattern on a substrate being fabricated in a maskless photolithography system;
  wherein said computing device operates in conjunction with said maskless photolithography system and executes said computer code to control said micromirror array according to said received pattern information and alignment information.

30. The computer system according to claim 29, wherein the means for controlling the position of the alignment fixture is interconnected with the computer system such that control of the position of the alignment fixture is coordinated with control of the position of each micromirror of said array of micromirrors by the computer system.

31. The computer system according to claim 29, wherein step 6 further comprises providing instructions to a means for rotating the alignment fixture in at least one direction.

32. The computer system according to claim 31, wherein the means for controlling the rotation of the alignment fixture in at least a first direction is interconnected with the computer system such that control of the rotation of the alignment fixture is coordinated with control of the position of each micromirror of said array of micromirrors by the computer system.

33. The computer system of claim 29, further comprising a dedicated interface for receiving alignment information.

34. The computer system of claim 29, further comprising a dedicated interface for providing pattern information and alignment commands to a micromirror array.

35. The computer system of claim 29, further comprising computer code for varying the angular position of said micromirrors when exposing a substrate, whereby pixelation and stiction are reduced.

36. A computer program product recorded on computer readable medium for a maskless photolithography system, comprising:
  a. computer readable medium for receiving mask pattern information corresponding to a desired pattern to be created on a substrate;
  b. computer readable medium for generating mask patterns based on received mask pattern information;
  c. computer readable medium for providing said mask patterns to an array of positionable micromirrors, operably connected to and controllable by said computer system;
  d. computer readable medium for receiving alignment information corresponding to alignment of a desired mask pattern projected onto the substrate;
  e. computer readable medium for generating alignment instructions based on received alignment information;
  f. computer readable medium for generating alignment instructions based on received alignment information to a means for positioning an alignment fixture in which the substrate is mounted;
  g. computer readable medium for providing alignment instructions, based on said alignment information, to said micromirror array to further align said mask patterns in the coplanar first and second dimensions:
  h. computer readable medium for adjusting the micromirror array according to said alignment instructions by shifting the mask pattern in at least one of the coplanar first and second dimensions; and i. computer readable medium for repeating steps (a-h) to create a desired pattern on the substrate being fabricated in a maskless photolithography system;

wherein said computer program product provides instructions for a computer system operating in conjunction with said maskless photolithography system to control said micromirror array according to said received pattern information and alignment information.

37. The computer program product according to claim 36, further comprising:

a computer readable medium for generating alignment instructions based on received alignment information to a means for rotating the alignment fixture in which the substrate is mounted.

38. The computer program product according to claim 36, further comprising computer readable medium for varying the angular position and time duration of angular positioning of said micromirrors when exposing the substrate, whereby pixelation and stiction are reduced.

39. A system for maskless photolithography, comprising:

an alignment fixture for mounting a substrate, wherein said alignment fixture allows alignment of the substrate in coplanar first and second dimensions, and in a third dimension direction substantially perpendicular to the first and second coplanar dimensions;

an array of micromirrors;

a means for directing light onto the array of micromirrors, wherein light incident on each micromirror of the array of micromirrors can be reflected by the each micromirror so as to be incident on the substrate mounted in the alignment fixture when the each micromirror is at or near a first position and can be reflected by the each micromirror so as to not be incident on the substrate mounted in the alignment fixture when the each micromirror is not at or near the first position;

a means for controlling the position of each micromirror of said array of micromirrors individually such that each micromirror is individually positioned to either reflect the light incident on the each micromirror so as to be incident on the substrate mounted in the alignment fixture or reflect the light incident on the each micromirror so as not to be incident on the substrate mounted in the alignment fixture, wherein some, all, or none of the light incident on the array of micromirrors is reflected onto the substrate mounted in the alignment fixture according to a desired mask pattern;

a means for controlling the position of the alignment fixture in the first, second, and third dimensions, such that controlling the position of the alignment fixture in the first, second, and third dimensions controls the position of the substrate in the first, second, and third dimensions.

40. The system according to claim 39, further comprising:

a means for controlling the rotation of the alignment fixture in at least a first direction such that controlling the rotation of the alignment fixture in the at least first direction controls the rotation of the substrate in the at least first direction.

41. The system according to claim 40, wherein the means for controlling the rotation of the alignment fixture in at least a first direction controls the rotation of the alignment fixture in a first direction, controls the rotation of the alignment fixture in a second direction perpendicular to the first direction, and controls the rotation of the alignment fixture in a third direction perpendicular to both the first direction and the second direction.

42. The system according to claim 40, wherein the means for controlling the position of each micromirror of said array of micromirrors is a computer system which receives the desired mask pattern and controls the positions of each micromirror of the array of micromirrors so that some, all, or none of the light incident on the array of micromirrors is reflected onto the substrate mounted in the alignment fixture according to the desired mask pattern.

43. The system according to claim 39, wherein the means for controlling the position of the alignment fixture is interconnected with the computer system such that control of the position of the alignment fixture is coordinated with control of the position of each micromirror of said array of micromirrors by the computer system.

44. The system according to 40, wherein the means for controlling the rotation of the alignment fixture in at least a first direction is interconnected with the computer system such that control of the rotation of the alignment fixture is coordinated with control of the position of each micromirror of said array of micromirrors by the computer system.

45. The system according to claim 42, wherein the computer system receives a plurality of desired mask patterns and controls the positions of each micromirror of the array of micromirrors according to each of the plurality of desired mask patterns sequentially, wherein the means for controlling the position of the alignment fixture repositions the substrate mounted in the alignment fixture in the third dimension direction between one or more of the plurality of desired mask patterns.

46. The system according to claim 42, further comprising: a computer controlled mask pattern alignment system for alignment of the desired mask pattern in the coplanar first and second dimensions, wherein the mask pattern alignment system adjusts the alignment of the desired mask pattern with respect to the substrate mounted in the alignment fixture in the coplanar first and second dimensions by altering the positioning of the micromirrors of the array of micromirrors in response to alignment information provided to the computer controlled mask pattern alignment system.

47. The system according to claim 39, wherein the means for directing light onto the array of micromirrors comprises a first optical system for generating, collimating, and directing a light beam to the array of micromirrors.

48. The system according to claim 47, further comprising:

a second optical system for collimating the light beam reflected from the array of micromirrors and directing the light beam onto the substrate mounted in the alignment fixture.

49. The system according to claim 39, wherein the means for controlling the position of each micromirror of the array of micromirrors dynamically varies the position of one or more of the micromirrors of the array of micromirrors such that pixelation is reduced.

50. The system according to claim 39, wherein the means for controlling the position of each micromirror of the array of micromirrors dynamically varies the position of one or more of the micromirrors of the array of micromirrors such that stiction is reduced.

51. The system according to claim 39,
wherein the substrate is a photoresist coated substrate, wherein light reflected by the array of micromirrors onto the photoresist coated substrate exposes a portion of the photoresist.

52. The system according to claim 39,
wherein the substrate is a photoreactive chemical coated substrate, wherein light reflected by the array of micromirrors onto the photoreactive chemical coated substrate causes a reaction between a portion of photoreactive chemicals and the photoreactive chemical coated substrate.

53. A method for maskless photolithography, comprising:
mounting a substrate onto an alignment fixture, wherein said alignment fixture allows alignment of the substrate in coplanar first and second dimensions, and in a third dimension direction substantially perpendicular to the first and second coplanar dimensions, wherein the alignment fixture comprises a means for controlling the position of the alignment fixture in the first, second, and third dimensions, such that controlling the position of the alignment fixture is the first, second, and third dimensions controls the position of the substrate in the first, second, and third dimensions directing light onto an array of micromirrors, wherein light incident on each micromirror of the array of micromirrors can be reflected by the each micromirror so as to be incident on the substrate mounted in the alignment fixture when the each micromirror is at or near a first position and can be reflected by the each micromirror so as to not be incident on the substrate mounted in the alignment fixture when the each micromirror is not at or near the first position;

controlling the position of the alignment fixture in the first, second, and third dimensions so as to control the position of the substrate in the first, second, and third dimensions;

controlling the position of each micromirror of said array of micromirrors individually such that each micromirror is individually positioned to either reflect the light incident on the each micromirror so as to be incident on the substrate mounted in the alignment fixture or reflect the light incident on the each micromirror so as not to be incident on the substrate mounted in the alignment fixture, wherein some, all, or none of the light incident on the array of micromirrors is reflected onto the substrate mounted in the alignment fixture according to a desired mask pattern.

54. The method according to claim 53,
wherein the alignment fixture comprises a means for controlling the rotation of the alignment fixture in at least a first direction such that controlling the rotation of the alignment fixture in at least first direction controls the rotation of the substrate in the at least first direction, wherein the method further comprises controlling the rotation of the alignment fixture in the at least a first direction so as to control the rotation of the substrate in the at least first direction.

55. The method according to 54, wherein the means for controlling the rotation of the alignment fixture in at least a first direction controls the rotation of the alignment fixture in the first direction, controls the rotation of the alignment fixture in a second direction perpendicular to the first direction, and controls the rotation of the alignment fixture in a third direction perpendicular to the first direction and perpendicular to the second direction, wherein controlling the rotation of the alignment fixture in at least a first direction comprises controlling the rotation of the alignment fixture in the first direction, controlling the rotation of the alignment fixture in a second direction perpendicular to the first direction, and controlling the rotation of the alignment fixture in a third direction perpendicular to the first direction and perpendicular to the second direction.

56. The method according to claim 53,
wherein controlling the position of each micromirror of said array of micromirrors comprises receiving the desired mask pattern via a computer system and controlling via the computer system the positions of each micromirror of the array of micromirrors so that some, all, or none of the light incident on the array of micromirrors is reflected onto the substrate mounted in the alignment fixture according to the desired mask pattern.

57. The method according to claim 53,
wherein controlling the position of the alignment fixture in the first, second, and third dimensions comprises receiving the desired mask pattern via a computer system and controlling via the computer system the means for controlling the position of the alignment fixture so as to control the position of the substrate.

58. The method according to claim 54,
wherein controlling the rotation of the alignment fixture in the at least first direction comprises receiving the desired mask pattern via a computer system and controlling via the computer system the means for controlling the rotation of the alignment fixture so as to control the rotation of the substrate.

59. The method according to claim 56,
wherein controlling the position of each micromirror of said array of micromirrors comprises receiving a plurality of desired mask patterns and controls the positions of each micromirror of the array of micromirrors according to each of the plurality of desired mask patterns sequentially, and repositioning the substrate mounted in the alignment fixture in the third dimension direction between controlling via the computer system the positions of each micromirror of the array of micromirrors one or more of the plurality of desired mask patterns.

60. The method according to claim 59,
wherein repositioning the substrate mounted in the alignment fixture in the third dimension direction comprises controlling via the computer system the means for controlling the position of the alignment fixture so as to control the position of the substrate.

61. The method according to claim 56, further comprising:
for aligning the desired mask pattern in the coplanar first and second dimensions via a computer controlled mask pattern alignment system,
adjusting the alignment of the desired mask pattern with respect to the substrate mounted in the alignment fixture in the coplanar first and second dimensions by altering the positioning of the micromirrors of the array of micromirrors in response to alignment information provided to the computer controlled mask pattern alignment system.

62. The method according to claim 54,
wherein directing light onto the array of micromirrors comprises generating, collimating, and directing a light beam to the array of micromirrors.

63. The method according to claim 62, further comprising:
  collimating the light beam reflected from the array of micromirrors and directing the light beam onto the substrate mounted in the alignment fixture.

64. The method according to claim 54,
  wherein controlling the position of each micromirror of the array of micromirrors comprises dynamically varying the position of one or more of the micromirrors of the array of micromirrors such that pixelation is reduced.

65. The method according to claim 54,
  wherein controlling the position of each micromirror of the array of micromirrors comprises dynamically varying the position of one or more of the micromirrors of the array of micromirrors such that stiction is reduced.

66. The method according to claim 54, further comprising:
  coating the substrate with a photoresist, wherein light reflected by the array of micromirrors onto the photoresist coated substrate exposes a portion of the photoresist.

67. The method according to claim 54, further comprising:
  coating the substrate with a photoreactive chemical, wherein light reflected by the array of micromirrors onto the photoreactive chemical coated substrate causes a reaction between a portion of photoreactive chemicals and the photoreactive chemical coated substrate.

68. A system for maskless photolithography, comprising:
  an alignment fixture for mounting a substrate, wherein said alignment fixture allows alignment of the substrate in coplanar first and second dimensions, and in a third dimension direction substantially perpendicular to the first and second coplanar dimensions;
  an array of micromirrors;
  a means for directing light onto the array of micromirrors, wherein light incident on each micromirror of the array of micromirrors can be reflected by the each micromirror so as to be incident on the substrate mounted in the alignment fixture when the each micromirror is at or near a first position and can be reflected by the each micromirror so as to not be incident on the substrate mounted in the alignment fixture when the each micromirror is not at or near the first position;
  a means for controlling the position of each micromirror of said array of micromirrors individually such that each micromirror is individually positioned to either reflect the light incident on the each micromirror so as to be incident on the substrate mounted in the alignment fixture or reflect the light incident on the each micromirror so as not to be incident on the substrate mounted in the alignment fixture, wherein some, all, or none of the light incident on the array of micromirrors is reflected onto the substrate mounted in the alignment fixture according to a desired mask pattern,
  wherein the means for controlling the position of each micromirror of the array of micromirrors dynamically varies the position of one or more of the micromirrors of the array of micromirrors such that pixelation and stiction are reduced.

69. The system according to claim 68, further comprising:
  a means for controlling the position of the alignment fixture in the first, second, and third dimensions, such that controlling the position of the alignment fixture in the first, second, and third dimensions controls the position of the substrate in the first, second, and third dimensions.

70. The system according to claim 68, further comprising:
  a means for controlling the rotation of the alignment fixture in at least a first direction such that controlling the rotation of the alignment fixture in the at least first direction controls the rotation of the substrate in the at least first direction.

71. The system according to claim 70,
  wherein the means for controlling the rotation of the alignment fixture in at least a first direction controls the rotation of the alignment fixture in the first direction, controls the rotation of the alignment fixture in a second direction perpendicular to the first direction and controls the rotation of the alignment fixture in a third direction perpendicular to the first direction and perpendicular to the second direction.

72. The system according to claim 68,
  wherein the means for controlling the position of each micromirror of said array of micromirrors is a computer system which receives the desired mask pattern and controls the positions of each micromirror of the array of micromirrors so that some, all, or none of the light incident on the array of micromirrors is reflected onto the substrate mounted in the alignment fixture according to the desired mask pattern.

73. The system according to claim 72,
  wherein the computer system controls the means for controlling the position of the alignment fixture, such that the control of the position of the alignment fixture and control of the position of each micromirror of said array of micromirrors is coordinated by the computer system.

74. The system according to claim 72,
  wherein the computer system controls the means for controlling the rotation of the alignment fixture, such that the control of the rotation of the alignment fixture and control of the position of each micromirror of said array of micromirrors is coordinated by the computer system.

75. The system according to claim 72, further comprising:
  a computer controlled mask pattern alignment system for alignment of the desired mask pattern in a coplanar first and second dimensions wherein the mask pattern alignment system adjusts the alignment of the desired mask pattern with respect to the substrate mounted in the alignment fixture in the coplanar first and second dimensions by altering the positioning of the micromirrors of the array of micromirrors in response to alignment information provided to the computer controlled mask pattern alignment system.

76. The system according to claim 68,
  wherein the means for directing light onto the array of micromirrors comprises a first optical system for generating, collimating, and directing a light beam to the array of micromirrors.

77. The system according to claim 76, further comprising:
  a second optical system for collimating the light beam reflected from the array of micromirrors and directing the light beam onto the substrate mounted in the alignment fixture.

78. The system according to claim 68,
  wherein the substrate is a photoresist coated substrate, wherein light reflected by the array of micromirrors onto the photoresist coated substrate exposes a portion of the photoresist.

79. The system according to claim 68,
wherein the substrate is a photoreactive chemical coated substrate, wherein light reflected by the array of micromirrors onto the photoreactive chemical coated substrate causes a reaction between a portion of photoreactive chemicals and the photoreactive chemical coated substrate.

80. A method for maskless photolithography, comprising:
mounting a substrate onto an alignment fixture, wherein the alignment fixture comprises a means for controlling the position of the alignment fixture in the first, second, and third dimensions, such that controlling the position of the alignment fixture in the first, second, and third dimensions controls the position of the substrate in the first, second, and third dimensions;
directing light onto an array of micromirrors, wherein light incident on each micromirror of the array of micromirrors can be reflected by the each micromirror so as to be incident on the substrate mounted in the alignment fixture when the each micromirror is at or near a first position and can be reflected by the each micromirror so as to not be incident on the substrate mounted in the alignment fixture when the each micromirror is not at or near the first position;
controlling the position of each micromirror of said array of micromirrors individually such that each micromirror is individually positioned to either reflect the light incident on the each micromirror so as to be incident on the substrate mounted in the alignment fixture or reflect the light incident on the each micromirror so as not to be incident on the substrate mounted in the alignment fixture, wherein some, all, or none of the light incident on the array of micromirrors is reflected onto the substrate mounted in the alignment fixture according to a desired mask pattern;
wherein controlling the position of each micromirror of the array of micromirrors comprises dynamically varying the position of one or more of the micromirrors of the array of micromirrors such that pixelation and stiction are reduced.

81. The method according to claim 80,
wherein the alignment fixture comprises a means for controlling the rotation of the alignment fixture in at least a first direction such that controlling the rotation of the alignment fixture in the at least first direction controls the rotation of the substrate in the at least first direction.

82. The method according to claim 81,
wherein the means for controlling the rotation of the alignment fixture in at least a first direction controls the rotation of the alignment fixture in the first direction, controls the rotation of the alignment fixture in a second direction perpendicular to the first direction and controls the rotation of the alignment fixture in a third direction perpendicular to the first direction and perpendicular to the second direction.

83. The method according to claim 80,
wherein controlling the position of each micromirror of said array of micromirrors comprises receiving the desired mask pattern via a computer system and controlling via the computer system the positions of each micromirror of the array of micromirrors so that some, all, or none of the light incident on the array of micromirrors is reflected onto the substrate mounted in the alignment fixture according to the desired mask pattern.

84. The method according to claim 83,
wherein controlling the position of the alignment fixture comprises receiving the desired mask pattern via a computer system and controlling via the computer system the position of the alignment fixture.

85. The method according to claim 83,
wherein controlling the rotation of the alignment fixture comprises receiving the desired mask pattern via a computer system and controlling via the computer system the rotation of the alignment fixture.

86. The method according to claim 83, further comprising:
aligning the desired mask pattern in a coplanar first and second dimensions via a computer controlled mask pattern alignment system,
adjusting the alignment of the desired mask pattern with respect to the substrate mounted in the alignment fixture in the coplanar first and second dimensions by altering the positioning of the micromirrors of the array of micromirrors in response to alignment information provided to the computer controlled mask pattern alignment system.

87. The method according to claim 80,
wherein directing light onto the array of micromirrors comprises generating, collimating, and directing a light beam to the array of micromirrors.

88. The method according to claim 87, further comprising:
collimating the light beam reflected from the array of micromirrors and directing the light beam onto the substrate mounted in the alignment fixture.

89. The method according to claim 80, further comprising:
coating the substrate with a photoresist, wherein light reflected by the array of micromirrors onto the photoresist coated substrate exposes a portion of the photoresist.

90. The method according to claim 80, further comprising:
coating the substrate with a photoreactive chemical, wherein light reflected by the array of micromirrors onto the photoreactive chemical coated substrate causes a reaction between a portion of photoreactive chemicals and the photoreactive chemical coated substrate.

* * * * *

UNITED STATES PATENT AND TRADEMARK OFFICE
CERTIFICATE OF CORRECTION

| | | |
|---|---|---|
| PATENT NO. | : 7,271,877 B2 | |
| APPLICATION NO. | : 11/398905 | |
| DATED | : September 18, 2007 | |
| INVENTOR(S) | : David P. Fries | |

It is certified that error appears in the above-identified patent and that said Letters Patent is hereby corrected as shown below:

Column 5,
Lines 33-34, "to use computer network" should read --to use a computer network--.
Line 40, "use expensive vacuum system" should read --use expensive vacuum systems--.

Column 9,
Line 38, "10 degrees form normal" should read --10 degrees from normal--.
Line 41, "away form the target" should read --away from the target--.

Column 11,
Line 36, "according the invention" should read --according to the invention--.

Column 14,
Line 28-29, "driven reflect light to the photosensitive material according to the mask pattern" should read
--driven to reflect light to the photosensitive material according to the mask pattern--.

Column 19,
Line 2, "multiplayer patterning" should read --multilayer patterning--.

Column 23,
Line 67, "dimensions:" should read --dimensions;--.

Column 24,
Line 63, "dimensions:" should read --dimensions;--.

Column 25,
Line 16, "further comprising computer readable medium" should read
--further comprising: a computer readable medium--.
Line 47, "mask pattern;" should read --mask pattern; and--.

Column 26,
Line 16, "according to 40" should read --according to claim 40--.

Column 27,
Line 22, "alignment fixture is the first" should read --alignment fixture in the first--.
Line 37, "dimensions;" should read --dimensions; and--.
Line 59, "according to 54" should read --according to claim 54--.

UNITED STATES PATENT AND TRADEMARK OFFICE
CERTIFICATE OF CORRECTION

PATENT NO. : 7,271,877 B2
APPLICATION NO. : 11/398905
DATED : September 18, 2007
INVENTOR(S) : David P. Fries It is certified that error appears in the above-identified patent and that said Letters Patent is hereby corrected as shown below:

Column 28,
Lines 36-37, "and controls the positions of" should read
 --and controlling the positions of--.
Lines 43-44, "micromirrors one or more of the plurality of desired mask patterns" should read --micromirrors for one or more of the plurality of desired mask patterns--.
Line 54, "for aligning the desired mask pattern" should read
 --aligning the desired mask pattern--.

Signed and Sealed this

First Day of July, 2008

JON W. DUDAS
*Director of the United States Patent and Trademark Office*